(12) United States Patent
Watazu et al.

(10) Patent No.: US 8,003,900 B2
(45) Date of Patent: Aug. 23, 2011

(54) MESH SHEET AND HOUSING FOR ELECTRONIC DEVICES

(75) Inventors: Yuji Watazu, Kyoto (JP); Shuzo Okumura, Kyoto (JP); Keishiro Murata, Kyoto (JP); Asako Sakashita, Kyoto (JP); Takahiro Okabe, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 0 days.

(21) Appl. No.: 12/867,341

(22) PCT Filed: Feb. 18, 2009

(86) PCT No.: PCT/JP2009/052770
§ 371 (c)(1),
(2), (4) Date: Aug. 12, 2010

(87) PCT Pub. No.: WO2009/104635
PCT Pub. Date: Aug. 27, 2009

(65) Prior Publication Data
US 2010/0326722 A1    Dec. 30, 2010

(30) Foreign Application Priority Data
Feb. 19, 2008    (JP) .................................. 2008-037258

(51) Int. Cl.
*H01L 23/06* (2006.01)
(52) U.S. Cl. ........ 174/565; 156/150; 156/245; 425/389; 428/102
(58) Field of Classification Search ............. 174/565; 156/150, 245; 425/389; 428/102
See application file for complete search history.

(56) References Cited

U.S. PATENT DOCUMENTS

| | | | |
|---|---|---|---|
| 4,772,760 | A | 9/1988 | Graham |
| 4,845,310 | A | 7/1989 | Postupack |
| 2007/0087209 | A1 | 4/2007 | Farhumand et al. |
| 2009/0051620 | A1 | 2/2009 | Ishibashi et al. |

FOREIGN PATENT DOCUMENTS

| | | |
|---|---|---|
| DE | 198 01 985 | 7/1999 |
| DE | 10 2005 049 447 | 4/2007 |
| EP | 1 868 263 | 12/2007 |
| JP | 53-15533 | 2/1978 |
| JP | 7-94190 | 4/1995 |

(Continued)

OTHER PUBLICATIONS

Patent Cooperation Treaty (PCT) International Preliminary Report on Patentability issued Oct. 14, 2010 in corresponding International Application No. PCT/JP2009/052770.

(Continued)

*Primary Examiner* — Xiaoliang Chen
(74) *Attorney, Agent, or Firm* — Wenderoth, Lind & Ponack, L.L.P.

(57) ABSTRACT

A mesh sheet of the present invention is a mesh sheet in which a metal mesh comprising fine bands is laminated on a surface of a base substrate, the mesh sheet being used and adhered along a surface of an arbitrary member having a curved surface portion. The metal mesh has a part in which the fine band positioned between connection points of the fine bands which are adjacent to each other is a curved line so as to absorb stress relative to deformation to be placed along the curved surface portion with a large curvature without destructing the metal mesh.

22 Claims, 35 Drawing Sheets

FOREIGN PATENT DOCUMENTS

| | | |
|---|---|---|
| JP | 10-223232 | 8/1998 |
| JP | 11-339812 | 12/1999 |
| JP | 2000-357518 | 12/2000 |
| JP | 2003-258483 | 9/2003 |
| JP | 2007-221609 | 8/2007 |
| WO | 2006/106982 | 10/2006 |

OTHER PUBLICATIONS

International Search Report issued Jun. 2, 2009 in International (PCT) Application No. PCT/JP2009/052770.

Supplementary European Search Report (in English language) issued Apr. 18, 2011 in corresponding European Patent Application No. 09 71 3436.

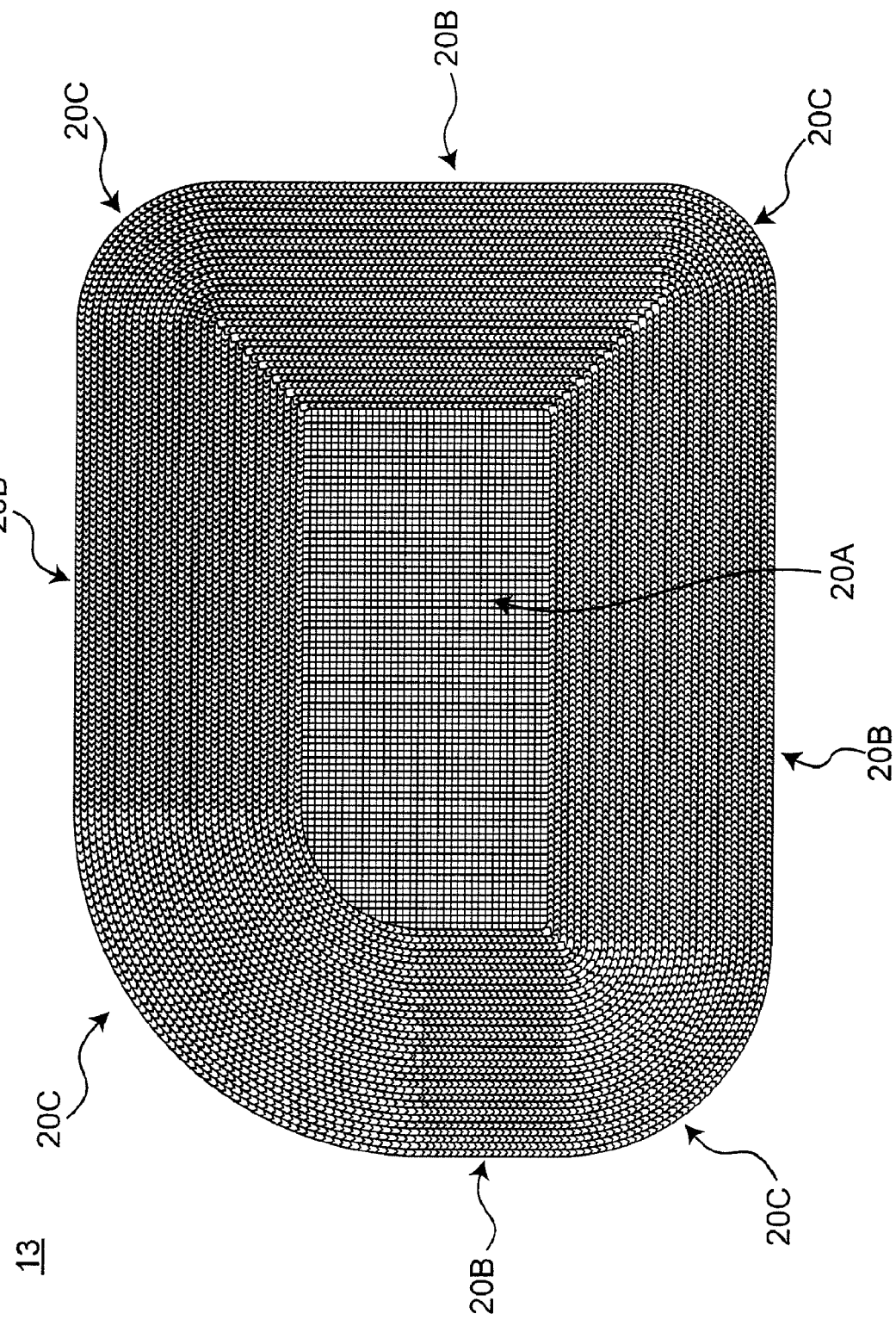

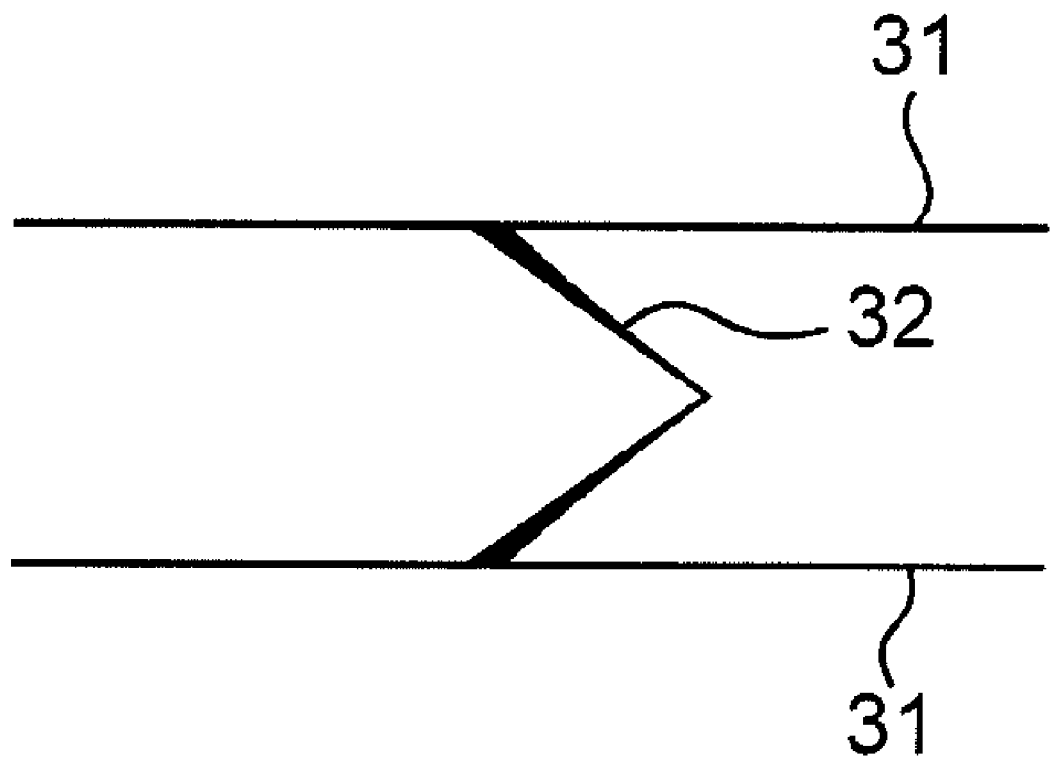

Fig.19
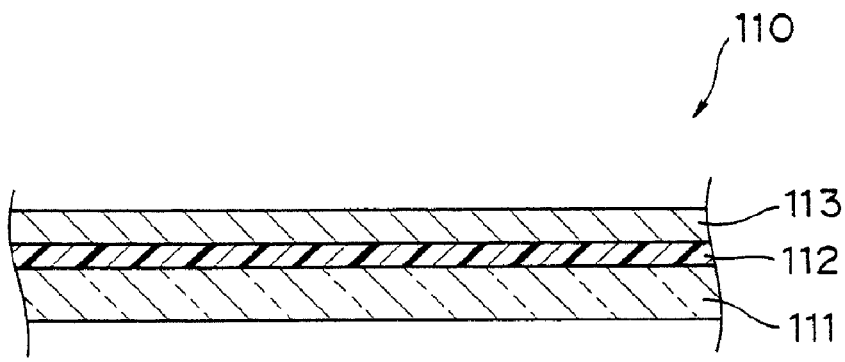
Fig.20
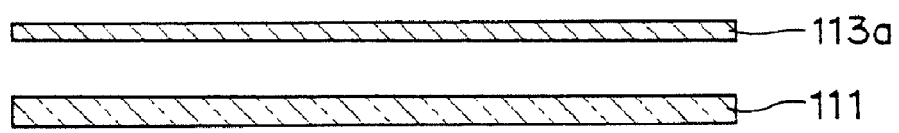
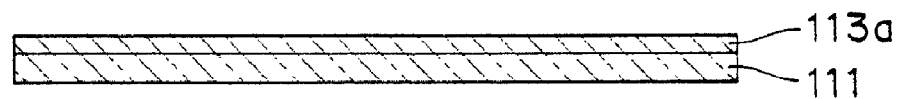
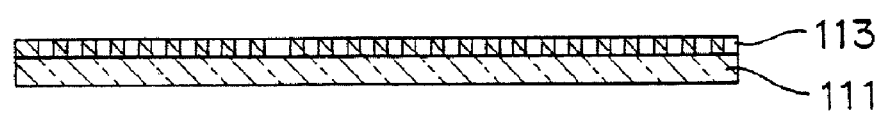

Fig.26
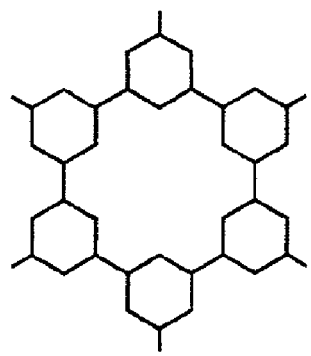
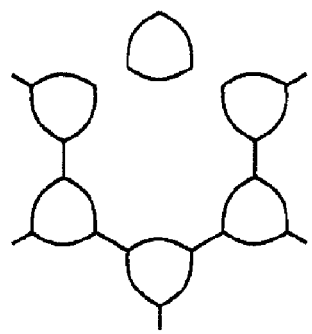
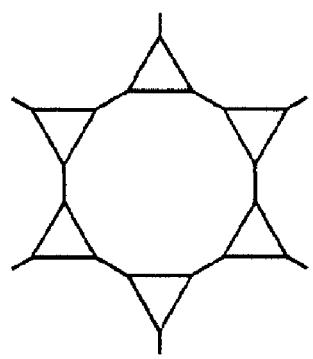

MESH SHEET AND HOUSING FOR ELECTRONIC DEVICES

TECHNICAL FIELD

The present invention relates to a housing for various electronic devices of mobile terminals such as a television and a cellular phone, particularly to a mesh sheet used in a housing for electronic devices having functions of an antenna for transmitting and receiving a radio wave of terrestrial broadcasting and satellite broadcasting, a capacitance type touch panel, and the like.

BACKGROUND ART

Conventionally, there is a known housing for electronic devices having functions of an antenna, a capacitance type touch panel, and the like. For example, Patent Document 1 (WO/2006/106982) discloses a housing for electronic devices including a molded resin material as a main constituting layer and an opaque decorative section, in which a front surface side of a layer providing a decoration of the decorative section has an antenna pattern in a planar form having a light transmittance of 70% or higher, and an electrically conductive section of the antenna pattern includes an electrically conductive thin film of a mesh structure, and an outline of each mesh is composed of fine bands having substantially equal widths.

For example, as shown in FIG. 34, this housing is formed by adhering a mesh sheet 200 having a light transmittance of 70% or higher in which a metal mesh having a band width of 30 μm or less for example is laminated on a transparent base film to a molded resin material 201.

The metal mesh provided in the mesh sheet 200 has mesh patterns shown in FIGS. 35A and 35B. In the mesh pattern shown in FIG. 35A, the fine bands are arranged in a grid. In the mesh pattern shown in FIG. 35B, the fine bands formed into regular hexagons are continuously arranged in a honeycomb shape. That is, the mesh sheet 200 has the mesh patterns formed by continuous polygons.

This mesh sheet 200 and the molded resin material 201 are adhered to each other for example by inserting the mesh sheet 200 into a mold so as to perform in-mold molding. The in-mold molding is a manufacturing method of preliminarily pressurizing and heating the mesh sheet 200, arranging the mesh sheet 200 in the mold after preforming the mesh sheet into a shape along an outline of the molded resin material 201, and then injecting melted resin into a cavity in the mold so as to integrally mold the mesh sheet 200 and the melted resin in the mold. Thereby, the housing in which the mesh sheet 200 is adhered to a surface of the molded resin material 201 is formed.

DISCLOSURE OF THE INVENTION

Problems to be Solved by the Invention

However, in a case where the housing is formed as described above, there is a need for deforming the mesh sheet 200 along the outline of the housing at the time of preforming. At this time, with a small extension ratio of the metal, when the mesh sheet is deformed along a curved surface with a large curvature (such as a fringe section of the molded resin material 201), there is an issue that stress is applied onto the metal mesh so that the fine bands forming the metal mesh are broken due to the deformation and the metal mesh is destructed. This issue is remarkably caused in a three-dimensional curved surface portion positioned in a round corner part of the molded resin material 201 rather than a two-dimensional curved surface portion positioned in a side part of the molded resin material 201.

Therefore, it is an object of the present invention to improve the above issue and to provide a mesh sheet capable of absorbing the stress due to the deformation to be placed along the curved surface portion with a large curvature without destructing the metal mesh, and a housing for electronic devices provided with the mesh sheet.

Means for Solving the Problems

In order to achieve the above object, the present invention provides the following configuration.

According to a first aspect of the present invention, there is provided a mesh sheet in which a metal mesh comprising fine bands is laminated on a surface of a base substrate comprising a resin sheet and having an insulation property, the mesh sheet being used and adhered along a surface of an arbitrary member having at least a three-dimensional curved surface portion, wherein the metal mesh has first fine band patterns and second fine band patterns arranged in a part to be adhered to the three-dimensional curved portion, the first fine band patterns being continuously arranged to be formed into an arc shape in parallel to a contour line direction of the three-dimensional curved portion and to be spaced from each other in a direction orthogonal to the contour line direction, and the second fine band patterns being continuously arranged to connect the first fine band patterns adjacent to each other and to be spaced from each other in the contour line direction, and the second fine band patterns placed between connection points with the first fine band patterns and the second fine band patterns are curved lines.

The phrase "the fine bands of the second fine band patterns . . . are curved lines" indicates that length of the fine bands of the second fine band patterns is longer than straight lines connecting the connection points with the first fine band patterns which are adjacent to each other and the second fine band patterns by the shortest distance. That is, the curved lines in the resent invention indicate line segments connecting two points on a plane by the shortest distance excluding straight lines. The curved lines include not only arc line segments but also curved line segments (that is, zigzag lines), or a combination of the line segments.

According to a second aspect of the present invention, there is provided the mesh sheet as defined in the first aspect, wherein an arrangement pitch of the first fine band patterns is 0.1 mm or more and 1.0 mm or less.

According to a third aspect of the present invention, there is provided the mesh sheet as defined in the first or second aspect, wherein band width of the first fine band patterns and band widths of the second fine band pattern are 10 μm or more and 40 μm or less.

According to a fourth aspect of the present invention, there is provided the mesh sheet as defined in any one of the first aspect to third aspect, wherein the base substrate and the metal mesh are adhered to each other with a thermoplastic adhesive.

According to a fifth aspect of the present invention, there is provided the mesh sheet as defined in any one of the first aspect to fourth aspect, wherein an arrangement pitch of the first fine band patterns is gradually narrowed toward an outer fringe section of the metal mesh.

According to a sixth aspect of the present invention, there is provided the mesh sheet as defined in any one of the first aspect to fifth aspect, wherein band width of the second fine band pattern in a vicinity of the connection point with the first fine band pattern and the second fine band pattern is larger than band width of other part.

According to a seventh aspect of the present invention, there is provided the mesh sheet as defined in any one of the first aspect to sixth aspect, wherein the first fine band pattern has wavy line pattern for allowing contraction in the contour line direction of the three-dimensional curved portion.

According to an eighth aspect of the present invention, there is provided the mesh sheet as defined in any one of the first aspect to seventh aspect, wherein the arbitrary member has a two-dimensional curved portion, the metal mesh has third fine band patterns and fourth fine band patterns arranged in a part to be adhered to the two-dimensional curved portion, the third fine band patterns being continuously arranged to be formed into a straight line shape in parallel to a contour line direction of the two-dimensional curved portion and to be spaced from each other in a direction orthogonal to the contour line direction, and the fourth fine band patterns being continuously arranged to connect the third fine band patterns adjacent to each other and to be spaced from each other in the contour line direction, and the fourth fine band patterns placed between connection points with the third fine band patterns and the fourth fine band patterns are curved lines.

According to a ninth aspect of the present invention, there is provided the mesh sheet as defined in the eighth aspect, wherein an arrangement pitch of the first fine band patterns is narrower than an arrangement pitch of the third fine band patterns.

According to a 10th aspect of the present invention, there is provided the mesh sheet as defined in the eighth or ninth aspect, wherein an arrangement pitch of the third fine band patterns is gradually narrowed toward an outer fringe section of the metal mesh.

According to an 11th aspect of the present invention, there is provided a mesh sheet in which a metal mesh comprising fine bands is laminated on a surface of a base substrate comprising a resin sheet and having an insulation property, the mesh sheet being used and adhered along a surface of an arbitrary member having a curved surface portion, wherein the metal mesh has unit patterns continuously arranged in multi-axial directions and leg portions arranged to connect a plurality of the unit patterns, and in any of the unit pattern, a fine band of the unit pattern placed between connection points with the adjacent leg portions and the unit pattern is a curved line.

According to a 12th aspect of the present invention, there is provided the mesh sheet as defined in the 11th aspect, wherein the fine band forming the metal mesh has a width of 40 μm or less.

According to a 13th aspect of the present invention, there is provided the mesh sheet as defined in the 11th or 12th aspect, wherein the base substrate and the metal mesh are adhered to each other with a thermoplastic adhesive.

According to a 14th aspect of the present invention, there is provided the mesh sheet as defined in the 13th aspect, wherein the base substrate is made of thermoplastic resin.

According to a 15th aspect of the present invention, there is provided the mesh sheet as defined in any one of the 11th aspect to 14th aspect, wherein the unit pattern is formed as closed figure with an identical shape and identical size.

According to a 16th aspect of the present invention, there is provided the mesh sheet as defined in the 15th aspect, wherein the unit patterns are arranged in a grid along two imaginary axes orthogonal to each other, and the leg portions are comprised of the fine bands connecting the unit patterns in the directions along the orthogonal imaginary axes.

According to a 17th aspect of the present invention, there is provided the mesh sheet as defined in the 16th aspect, wherein the unit pattern is formed as closed figure including arc.

According to an 18th aspect of the present invention, there is provided the mesh sheet as defined in the 16th aspect, wherein the unit pattern is formed into polygon, and the leg positions are formed from at least three tips among tips of the polygons.

According to a 19th aspect of the present invention, there is provided the mesh sheet as defined in the 15th aspect, wherein the unit patterns are formed into hexagons along three imaginary axes crossing each other by 120°, and the leg portions are comprised of the fine bands connecting the unit patterns in the directions along the three imaginary axes.

According to a 20th aspect of the present invention, there is provided the mesh sheet as defined in the 19th aspect, wherein the unit pattern is formed as closed figure including arc.

According to a 21st aspect of the present invention, there is provided the mesh sheet as defined in the 19th aspect, wherein the unit pattern is formed into polygon, and the leg positions are formed from at least three tips among tips of the polygon.

According to a 22nd aspect of the present invention, there is provided a mesh sheet in which a metal mesh comprising fine bands is laminated on a surface of a base substrate comprising a resin sheet and having an insulation property, the mesh sheet being used and adhered along a surface of an arbitrary member having a curved surface portion, wherein the metal mesh has leg portions comprising the fine bands of non-divergent curved lines.

According to a 23rd aspect of the present invention, there is provided a mesh sheet in which a metal mesh comprising fine bands is laminated on a surface of a base substrate comprising a resin sheet and having an insulation property, the mesh sheet being used and adhered along a surface of an arbitrary member having a curved surface portion, wherein the metal mesh has unit patterns formed as closed figures and continuously arranged in the single-axial direction and leg portions arranged to connect a plurality of the unit patterns.

According to a 24th aspect of the present invention, there is provided a housing for electronic devices comprising a molded resin material to which a mesh sheet as defined in any one of the first aspect to 23rd aspect is adhered.

Effects of the Invention

With the mesh sheet according to the first aspect of the present invention, the second fine band patterns are the curved lines. Thus, extension in the drawing direction can be absorbed by the second fine band patterns, so that breaking of the fine bands forming the metal mesh can be prevented. Therefore, it is possible to adhere the mesh sheet along the curved surface portion with the large curvature without destructing the metal mesh.

With the mesh sheet according to the eleventh aspect of the present invention, in a case where extension force is applied onto the metal mesh, a degree of curving of curved line parts is reduced by stress applied onto the fine bands forming the unit patterns. Thus, the mesh patterns can be extended as a whole. Therefore, even in a case where the base substrate forming the mesh sheet is extended, the mesh patterns are extended, so that the metal bands forming the mesh sheet are not broken and the mesh sheet itself can be extended.

Since the fine bands forming the metal mesh have the width of 40 μm or less, the metal mesh can be not easily visually recognized, and the mesh sheet excellent in a design property can be formed. It is noted that in this case, the base substrate is preferably formed by a transparent or semi-transparent material.

The metal mesh and the base substrate are adhered to each other with the thermoplastic adhesive. Thus, plasticity is slightly increased by heat, and in a case where extension stress is applied onto the fine bands of the metal mesh, the adhesive is deformed between the base substrate and the metal mesh, so that sliding of relative positions of the both is generated. Thereby, it is possible to suppress destruction of the fine bands of the metal mesh. In this case, since the base substrate is also made of the thermoplastic resin, the plasticity is more increased. Thus, it is possible to suppress the destruction of the fine bands upon deformation due to the extension stress.

The unit patterns are preferably formed as the closed figures with an identical shape and identical size. By arranging in the orthogonal biaxial or triaxial directions, the unit patterns can be closely arranged, and uneven distribution in the metal mesh is less caused. Thereby, the metal mesh can be not easily visually found.

Since the unit patterns are formed into a circular shape, an arc is placed between two connection points. Thus, it is possible to easily realize the fine bands of the curved lines.

Further, the unit patterns are formed into polygons, and the connection points are arranged in at least the three tips. Thus, two adjacent sides of the polygons can serve as the fine bands placed between the connection points, and it is possible to easily realize the fine bands of the curved lines.

BRIEF DESCRIPTION OF THE DRAWINGS

These and other aspects and features of the present invention will become clear from the following description taken in conjunction with the preferred embodiments thereof with reference to the accompanying drawings, in which:

FIG. 6 is a plan view showing a configuration of the metal mesh of the mesh sheet according to the first embodiment of the present invention;

FIG. 17 is an enlarged plan view showing a configuration example of a connection part between the fine band patterns arranged in parallel to the contour line direction and the fine band patterns connecting the fine band patterns which are adjacent to each other;

FIG. 19 is a sectional view showing a schematic configuration of the mesh sheet according to the second embodiment of the present invention;

FIG. 20 is a view showing processes in which the mesh sheet according to the second embodiment of the present invention is formed by the photo-etching;

FIG. 26 is a view showing deformation states before and after extension of the mesh sheet of FIG. 25;

BEST MODE FOR CARRYING OUT THE INVENTION

Before the description of the present invention proceeds, it is to be noted that like parts are designated by like reference symbols throughout the accompanying drawings.

Hereinafter, embodiments of the present invention will be described with reference to the drawings.

First Embodiment

A housing provided with a mesh sheet according to a first embodiment of the present invention can be used as an antenna for a cellular phone terminal or a capacitance type touch panel, for example. As one example, the cellular phone terminal using the housing as the antenna will be described.

Figure 1A:
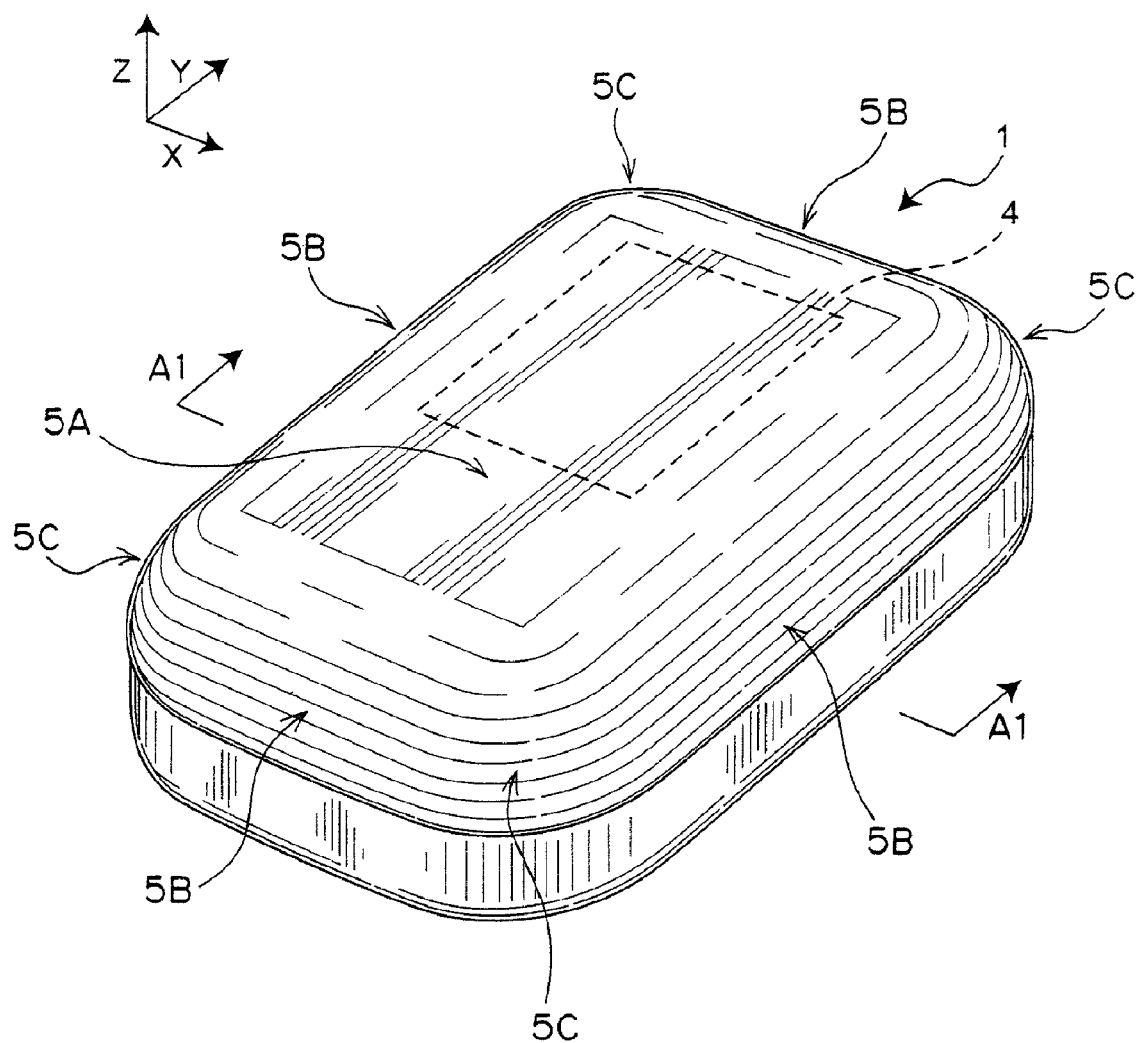
FIG. 1A is a perspective view showing an outer appearance of a housing for a cellular phone terminal provided with a mesh sheet according to a first embodiment of the present invention.
Figure 1B:
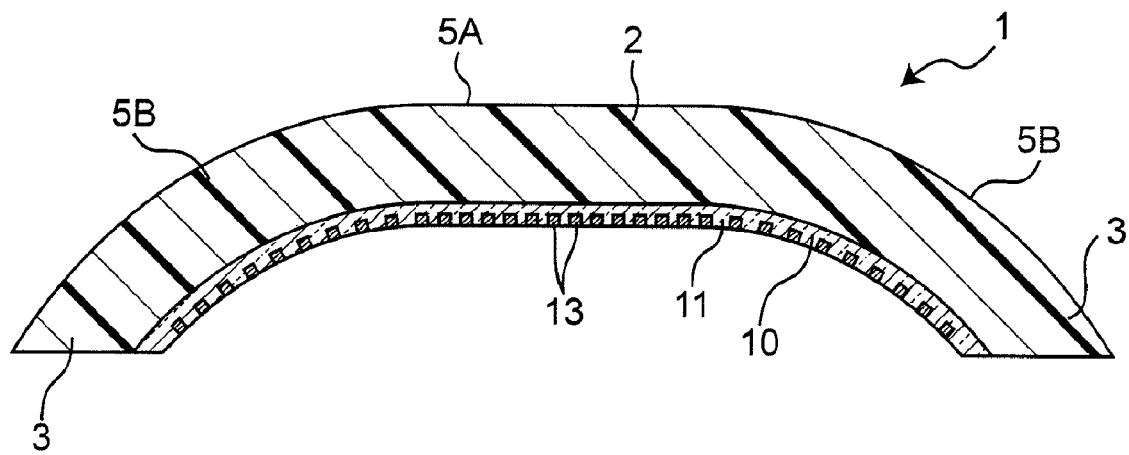
FIG. 1B is a sectional view of the housing for the cellular phone terminal taken along line A1-A1 in FIG. 1A.

FIG. 1A is a perspective view showing an outer appearance of the housing for the cellular phone terminal provided with the mesh sheet according to the first embodiment. FIG. 1B is a sectional view of the housing for the cellular phone terminal taken along line A1-A1 (XZ plane) in FIG. 1A.

In a housing (component) 1 shown in FIGS. 1A and 1B, antenna patterns formed by a mesh sheet 10 are formed on an inner surface of a molded resin material 2 serving as one example of an arbitrary member. As shown in FIG. 1A, the molded resin material 2 is a container-shaped member provided with a transparent window section 4 allowing to visually recognize a display section such as a liquid crystal display provided in the cellular phone terminal. A fringe section 3 of the molded resin material 2 is bent into an arch shape over the entire circumference. Thereby, a flat portion 5A is formed in a center part of the molded resin material 2, a two-dimensional curved surface portion 5B and a three-dimensional curved surface portion 5C are formed in the fringe section 3 of the molded resin material 2. The flat portion 5A is a part parallel to an XY plane. The two-dimensional curved surface portion 5B is a part having a section on the XZ plane curved into an arch shape and a section on a YZ plane formed into a straight line shape. The three-dimensional curved surface portion 5C is a part having both a section on the XZ plane and a section on the YZ plane curved into an arch shape.

The molded resin material 2 is molded into a desired shape of the housing 1. As a material of the molded resin material 2, a resin material such as polycarbonate, polyethylene naphthalate, polyethylene terephthalate, triacetyl cellulose, and acrylonitrile-butadiene-styrene resin can be used. The transparent window section 4 can be formed integrally with the other parts of the molded resin material 2 by a method such as two-color molding. The transparent window section 4 may be formed by fitting another transparent molded resin material into an opening for the transparent window section 4 of the molded resin material 2.

The mesh sheet 10 has antenna patterns in a planar form having a light transmittance of 70% or higher. The mesh sheet 10 is adhered over a wide area on the inner surface of the molded resin material 2, including inner surfaces of the two-dimensional curved surface portion 5B and the three-dimensional curved surface portion 5C.

For example, since a mold is closed in a state that the mesh sheet 10 is sandwiched in the mold at the time of molding the molded resin material 2 and melted resin is injected into a cavity of the mold, the mesh sheet 10 can be adhered to the surface of the molded resin material 2. The mesh sheet 10 to be sandwiched in the mold may be preliminarily preformed into a shape along a surface of the cavity. This preforming can be performed by pressing the mesh sheet 10 while heating with using a pressing device for preforming (not shown). The mesh sheet 10 is deformed by pressing force by the pressing device or injection pressure of the melted resin. Particularly, in a part corresponding to the three-dimensional curved surface portion 5C of the molded resin material 2, a deformation amount is increased as described in detail later.

Figure 2:
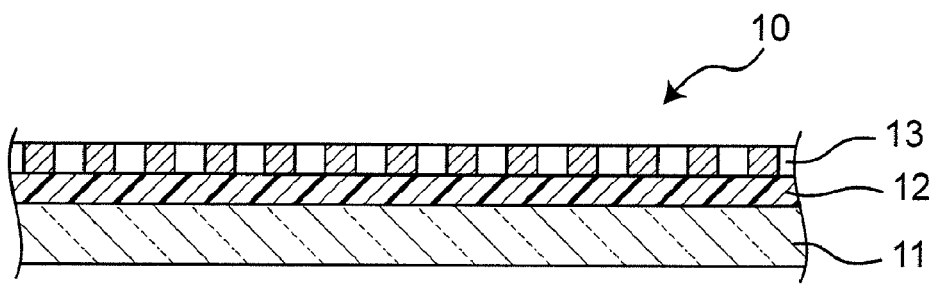
FIG. 2 is a sectional view showing a schematic configuration of the mesh sheet according to the first embodiment of the present invention.

FIG. 2 is a sectional view showing a schematic configuration of the mesh sheet 10. The mesh sheet 10 has a structure in which a metal mesh 13 is laminated on a surface of a base sheet 11 made of transparent or semi-transparent resin having an insulation property. An adhesive 12 including thermoplastic resin as a main constituting material is used for adhering the base sheet 11 and the metal mesh 13.

As the base sheet 11, a resin sheet such as polypropylene-based resin, polycarbonate resin, polyethylene-based resin, polyamide-based resin, polyester-based resin, polyacrylic resin, polyvinyl chloride-based resin, and acrylonitrile-butadiene-styrene resin can be used.

The adhesive 12 is preferably made of a material with the plasticity slightly increased by heat applied at the time of preforming or at the time of injecting the melted resin. Specifically, at the time of preforming or at the time of injecting the melted resin, the mesh sheet 10 is heated to substantially 180° C. Thus, the adhesive 12 is preferably made of an acrylic material with plasticity increased at about the temperature. The adhesive 12 is preferably formed to be about 30 μm to 50 μm which is slightly thicker than usual (generally, about 20 μm) so that the adhesive is easily deformed when the mesh sheet 10 is adhered along the surface of the two-dimensional curved surface portion 5E or the three-dimensional curved surface portion 5C of the molded resin material 2. Thereby, when stress is applied onto fine bands of the metal mesh 13, the adhesive 12 is deformed between the base sheet 11 and the metal mesh 13, so that sliding of relative positions of the both is generated. Thereby, it is possible to suppress destruction of the fine bands of the metal mesh 13. It is noted that when the base sheet 11 is also made of the thermoplastic resin at this time, it is possible to further suppress the destruction of the fine bands of the metal mesh 13.

The metal mesh 13 is made by forming metal fine bands such as copper, nickel, aluminum, gold, and silver into minute mesh patterns as described in detail later. The metal mesh 13 is opaque but the fine bands are highly fine. Thus, the metal highly-fine bands are only recognized as a slight change in a tone at a glance, so that a design property of the molded resin material 2 is not deteriorated. Since the metal mesh 13 can be formed along the entire surface of the housing, a relatively large area can be used as the antenna, so that receiver sensitivity can be enhanced. Further, the metal mesh is formed on the three-dimensional curved surface portion 5C, the directivity can be reduced. It is noted that the mesh sheet 10 may be provided on the transparent window section 4 as shown in FIG. 1A or provided in a part other than the transparent window section 4.

The metal mesh 13 can be formed by photo-etching or etching with using print resist of a metal foil with thickness of about 10 μm, for example. It is noted that excessively large band widths of the fine bands of the metal mesh 13 may deteriorate the design property of the molded resin material 2, whereas excessively small band widths may toughen the etching. Thus, the bandwidths are preferably 10 μm or more and 40 μm or less. An excessively wide arrangement pitch of the fine bands of the metal mesh 13 may deteriorate the design property of the molded resin material 2, where as an excessively narrow arrangement pitch may toughen the etching. Thus, the arrangement pitch is preferably 0.1 mm or more and 1.0 mm or less.

In a case where the mesh patterns of the metal mesh 13 are formed by the photo-etching, the following processes may be taken for example.

Figure 3:
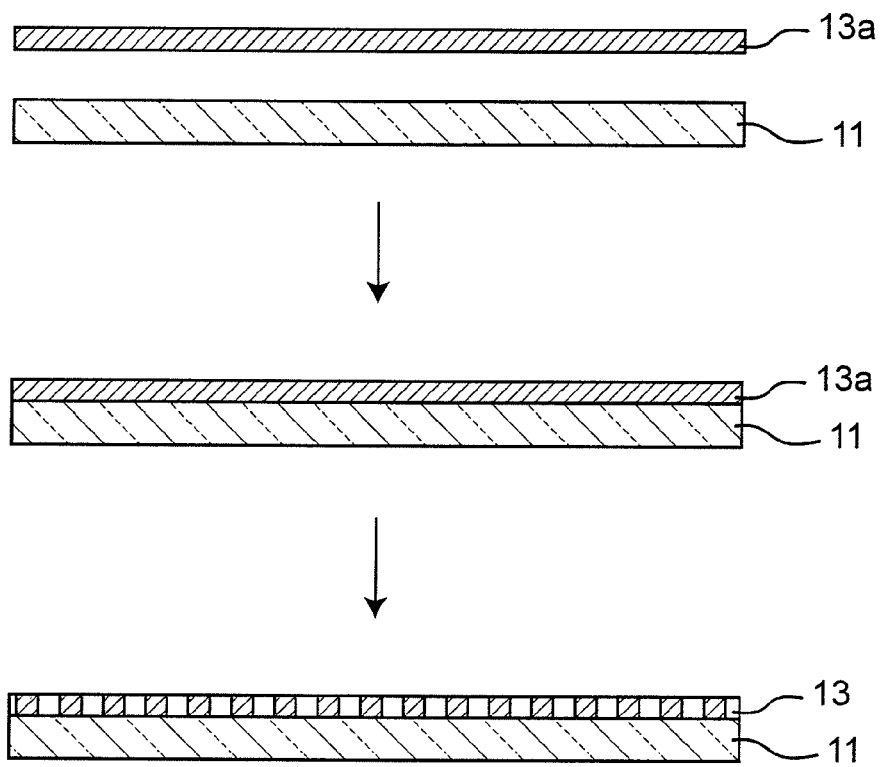
FIG. 3 is a view showing processes in which the mesh sheet according to the first embodiment of the present invention is formed by photo-etching.

Firstly, as shown in FIG. 3, a metal foil 13a is adhered to a surface of the base sheet 11. It is noted that in FIG. 3, the adhesive 12 is omitted.

Then, a photoresist film (not shown) is formed on the metal foil 13a.

The photoresist film is subjected to exposure with using a photomask and development using a liquid developer, so that mesh patterns of the photoresist film are formed.

The etching is performed with an etchant, and the photoresist film is separated and removed.

Thereby, the metal mesh 13 having mesh patterns formed by the metal fine bands can be formed.

Next, a configuration of the mesh patterns of the metal mesh 13 will be described in more detail.

As described above, the mesh sheet 10 is deformed at the time of preforming or at the time of injecting the melted resin, and particularly, the deformation amount is increased in the part corresponding to the three-dimensional curved surface portion 5C of the molded resin material 2. However, the resin base sheet 11 is endurable to relatively large deformation, while the metal mesh 13 is not endurable to large deformation. Thus, when the metal mesh is deformed (extended) to a fixed extent or more, there is an issue that the fine bands are broken. In the first embodiment, in order to improve the issue of breaking, this issue is improved by devising the mesh patterns of the metal mesh 13.

Figure 4:
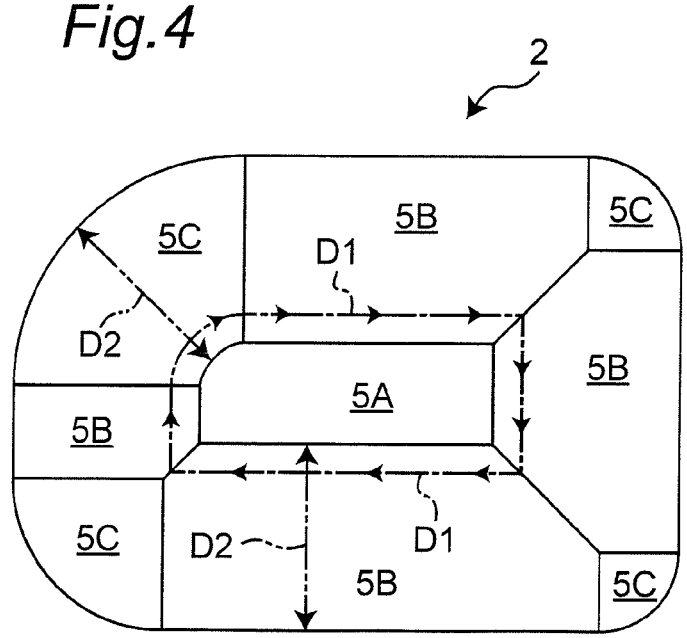
FIG. 4 is an illustrative view showing divided blocks including a flat portion, a two-dimensional curved surface portion, and a three-dimensional curved surface portion in a plan view of a molded resin material.
Figure 5A:
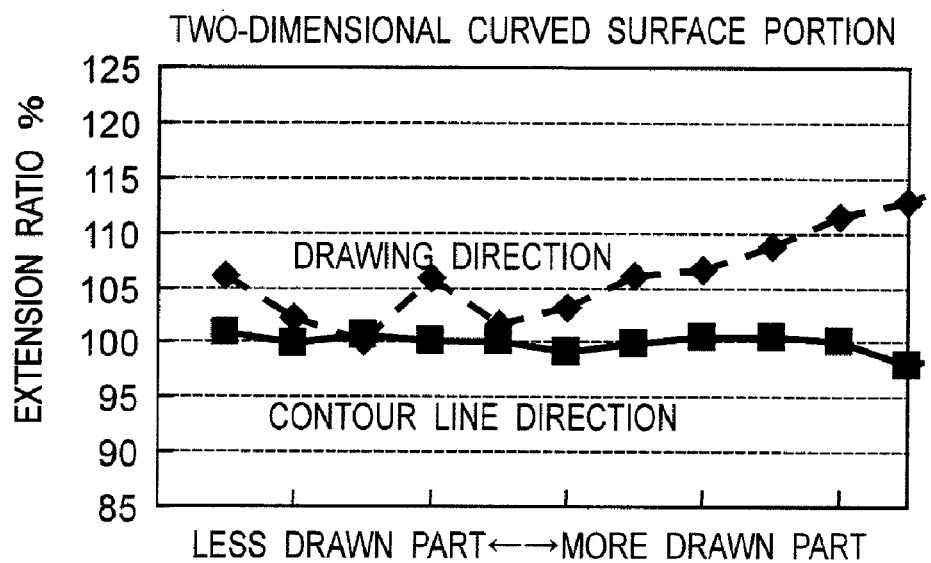
FIG. 5A is a graph showing extension ratios in the contour line direction and the drawing direction in a metal mesh adhered to the two-dimensional curved surface portion.
Figure 5B:
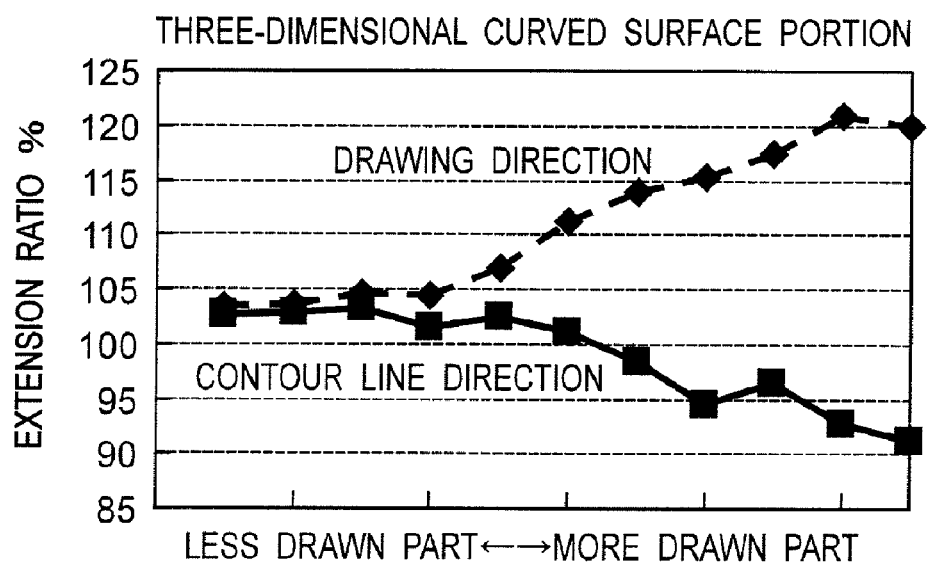
FIG. 5B is a graph showing extension ratios in the contour line direction and the drawing direction in the metal mesh adhered to the three-dimensional curved surface portion.

FIG. 4 is an illustrative view showing divided blocks including the flat portion 5A, the two-dimensional curved surface portion 5B, and the three-dimensional curved surface portion 5C in a plan view of the molded resin material 2. In FIG. 4, the reference symbol D1 denotes an extending direction of a line connecting positions with the same height from the flat portion 5A (hereinafter, called a contour line direction). The reference symbol D2 denotes a direction orthogonal to the contour line direction and along a curved surface of the two-dimensional curved surface portion 5B or the three-dimensional curved surface portion 5C (hereinafter, called a drawing direction). FIG. 5A is a graph showing extension ratios in the contour line direction D1 and the drawing direction D2 in the metal mesh adhered to the two-dimensional curved surface portion 5B. FIG. 5B is a graph showing extension ratios in the contour line direction D1 and the drawing direction D2 in the metal mesh adhered to the three-dimensional curved surface portion 5C. It is noted that in FIGS. 5A and 5B, a less drawn section indicates a part closer to the flat portion 5A, and a more drawn section indicates a part apart from the flat portion 5A, that is, a part on the side of the outer fringe section of the metal mesh. In other words, the distance from the flat portion 5A is gradually increased toward the right side of the figure.

From FIG. 5A, it is found that in the two-dimensional curved surface portion 5B, extension of the metal mesh 13 is hardly generated in the contour line direction D1, although about 10% extension of the metal mesh 13 is generated in the drawing direction D2. From FIG. 5B, it is found that in the three-dimensional curved surface portion 5C, about 10% contraction of the metal mesh 13 is generated in the contour line direction D1, although about 20% extension of the metal mesh 13 is generated in the drawing direction D2. It is noted that there is a plurality of the two-dimensional curved surface portions 5B and a plurality of the three-dimensional curved surface portions 5C in FIG. 4. However, the extension ratios show substantially similar tendencies in any of the two-dimensional curved surface portions 5B and the three-dimensional curved surface portions 5C. Based on this result, the mesh patterns of the metal mesh 13 of the mesh sheet 10 according to the first embodiment are formed.

FIG. 6 is a plan view showing a configuration of the metal mesh 13 of the mesh sheet 10 according to the first embodiment. As shown in FIG. 6, the metal mesh 13 has different mesh patterns respectively in an area 20A corresponding to the flat portion 5A, an area 20B corresponding to the two-dimensional curved surface portion 5B, and an area 20C corresponding to the three-dimensional curved surface portion 5C.

In the area 20A, the extension of the metal mesh 13 is hardly generated. Therefore, the mesh patterns arranged in the area 20A are formed into the same shape as the background art such as a grid.

Figure 7:
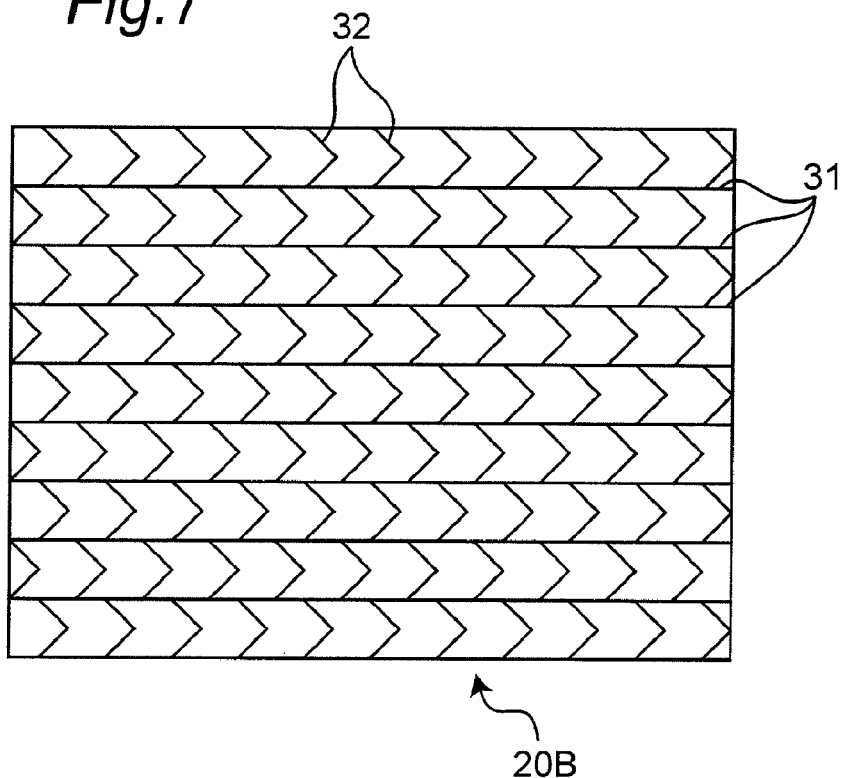
FIG. 7 is an enlarged plan view of an area of the metal mesh shown in FIG. 6 corresponding to the two-dimensional curved surface portion.
Figure 8:
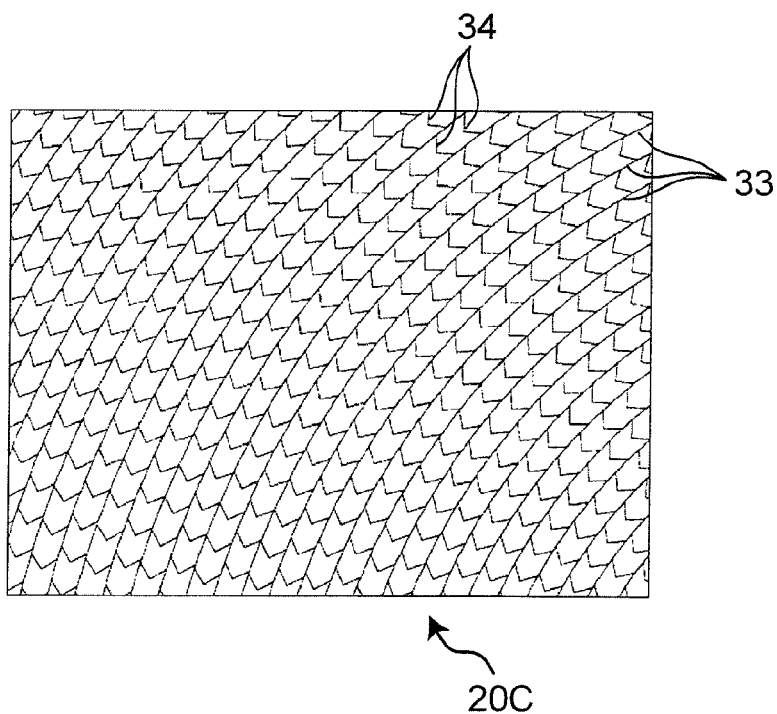
FIG. 8 is an enlarged plan view of an area of the metal mesh shown in FIG. 6 corresponding to the three-dimensional curved surface portion.
Figure 9:
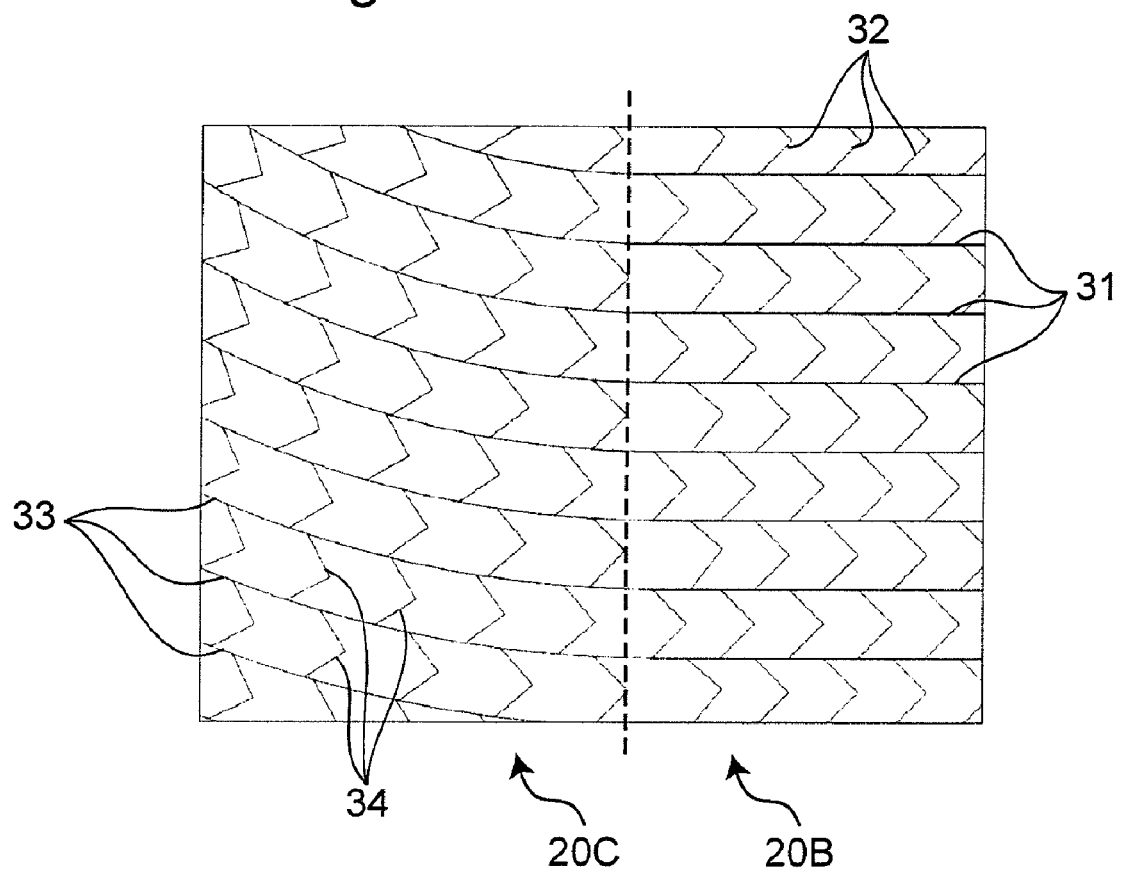
FIG. 9 is an enlarged plan view showing a configuration of a coupling part between the area corresponding to the two-dimensional curved surface portion and the area corresponding to the three-dimensional curved surface portion of the metal mesh shown in FIG. 6.

FIG. 7 is an enlarged plan view of the area 20B, FIG. 8 is an enlarged plan view of the area 20C, and FIG. 9 is an enlarged plan view showing a configuration of a coupling part between the area 20B and the area 20C.

As described above, in the area 20B, when the mesh sheet 10 is adhered to the molded resin material 2, the extension of the metal mesh 13 is hardly generated in the contour line direction D1. However, about 10% extension of the metal mesh 13 is generated in the drawing direction D2. Therefore, as shown in FIG. 7, fine band patterns (third fine band patterns) 31 formed into a straight line shape in parallel to the contour line direction D1 of the two-dimensional curved surface portion 5B are continuously arranged, and the fine band patterns 31, 31 which are adjacent to each other are connected by L-shaped fine band patterns (fourth fine band patterns) 32. Thereby, the fine band patterns 32 function as extension and contraction leg portions. Since bending angles of L-shaped parts of the fine band patterns 32 are enlarged, the extension in the drawing direction D2 can be absorbed, so that the breaking of the fine bands can be prevented. Therefore, it is possible to adhere the mesh sheet 10 along the two-dimensional curved surface portion 5B without destructing the metal mesh 13.

As described above, in the third area 20C, when the mesh sheet 10 is adhered to the molded resin material 2, about 10% contraction of the metal mesh 13 is generated in the contour line direction D1 and about 20% extension of the metal mesh 13 is generated in the drawing direction D2. Therefore, as shown in FIG. 8, fine band patterns (first fine band patterns) 33 formed into an arc shape in parallel to the contour line direction D1 of the three-dimensional curved surface portion 5C are continuously arranged, and the fine band patterns 33, 33 which are adjacent to each other are connected by L-shaped fine band patterns (second fine band patterns) 34. Thereby, the fine band patterns 34 function as extension and contraction leg portions. Since bending angles of L-shaped parts of the fine band patterns 34 are enlarged, the extension in the drawing direction D2 can be absorbed, so that the breaking of the fine bands can be prevented. Therefore, it is possible to adhere the mesh sheet 10 along the three-dimensional curved surface portion 5C without destructing the metal mesh 13.

Figure 10:
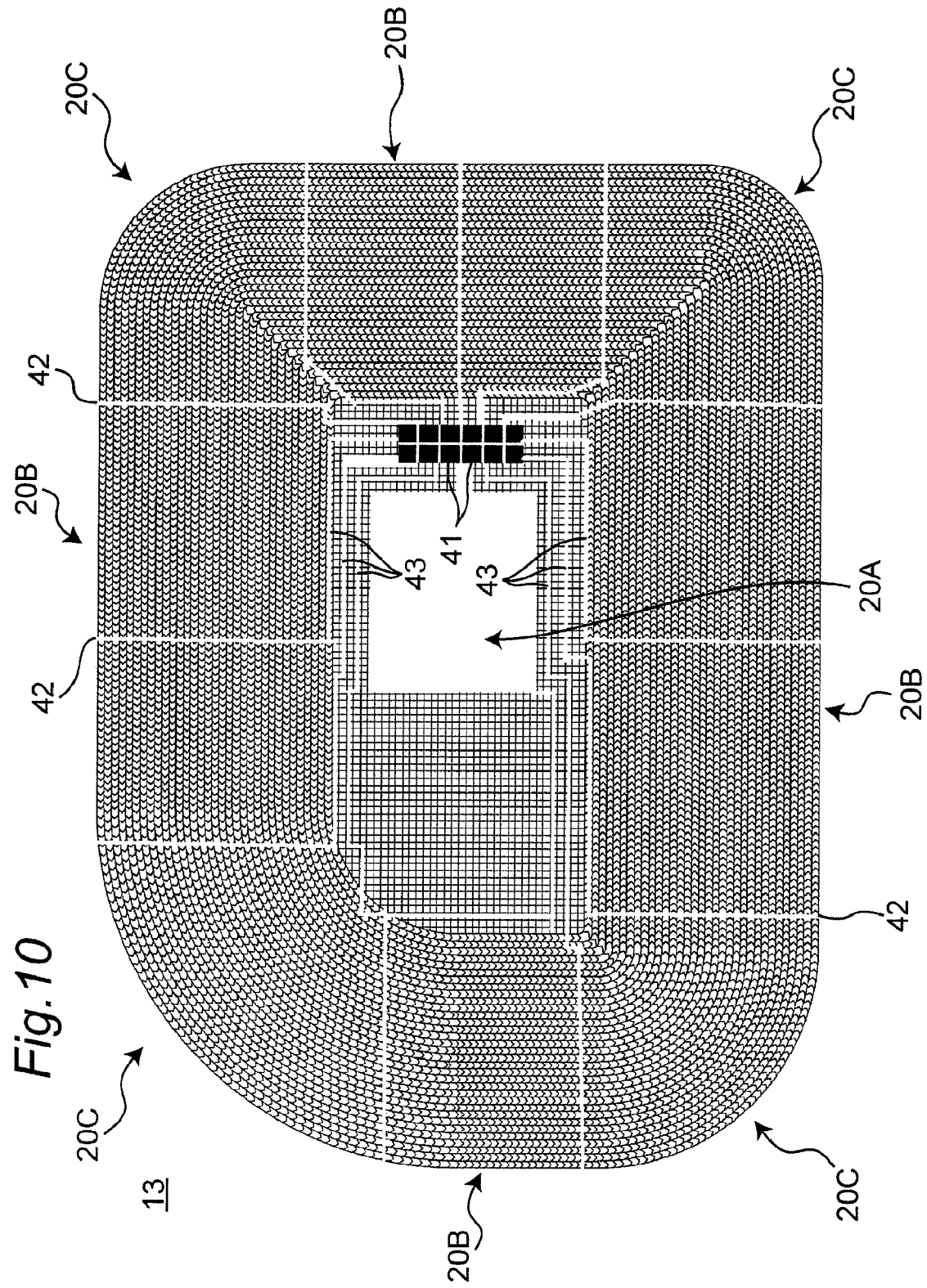
FIG. 10 is a plan view showing a design example in which power distributing electrodes are formed in the metal mesh shown in FIG. 6.

In a case where the mesh sheet 10 formed as described above is used for the cellular phone terminal, for example, as shown in FIG. 10, power distributing electrodes 41 and slits 42, 43 may be formed. That is, the mesh patterns are divided into a plurality of wiring sections by the slits 42, and the slits 43 are appropriately formed in the grid mesh patterns in the first area 20A so that the divided wiring sections are electrically connected to the power distributing electrodes 41 positioned in the first area 20A. It is noted that the power distributing electrodes 41 are preferably arranged in the first area 20A. This is because in a case where the power distributing electrodes 41 are arranged in the second area 20B or the third area 20C, the resin base sheet 11 is largely deformed at the time of preforming or at the time of injecting the melted resin, and size of the power distributing electrodes 41 is changed due to the deformation, so that the power distributing electrodes 41 and power distributing parts arranged thereon such as a FPC are not easily connected.

Figure 11:
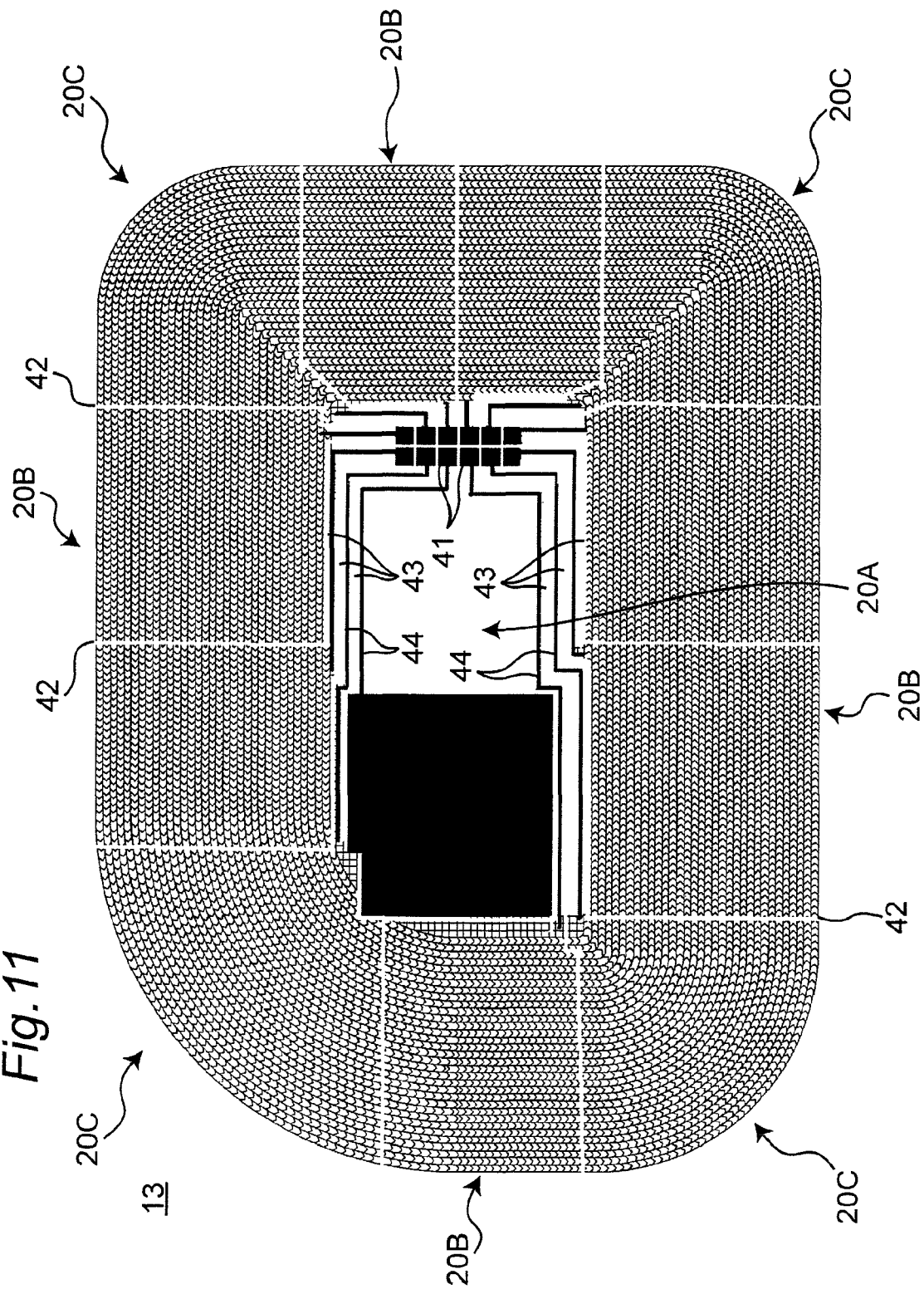
FIG. 11 is a plan view showing a design example which is different from FIG. 10.

It is noted that the wiring sections and the power distributing electrodes 41 may be connected by thick wires 44 as shown in FIG. 11 instead of the grid mesh patterns.

Figure 12A:
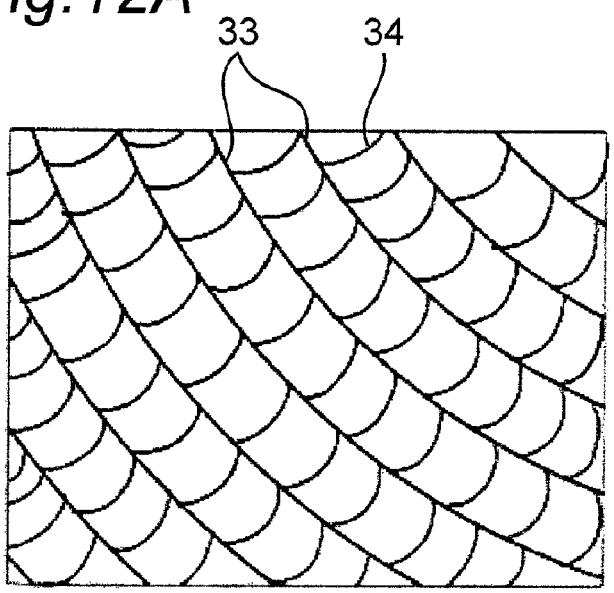
FIG. 12A is a plan view showing a first modified example of mesh patterns of the metal mesh.
Figure 12B:
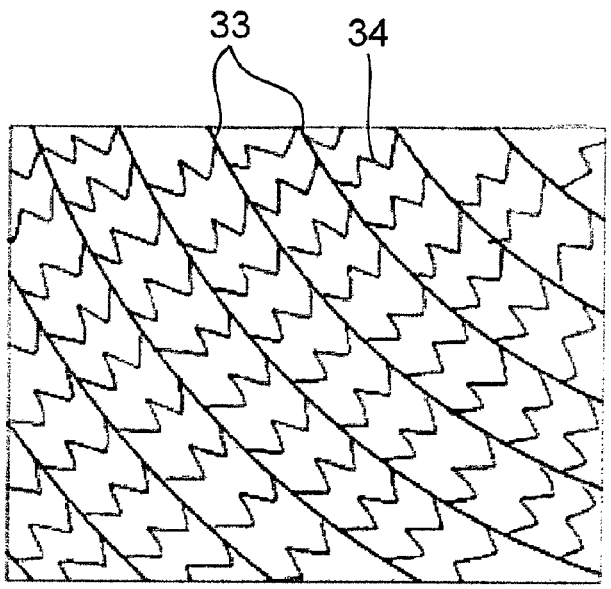
FIG. 12B is a plan view showing a second modified example of the mesh patterns of the metal mesh.
Figure 12C:
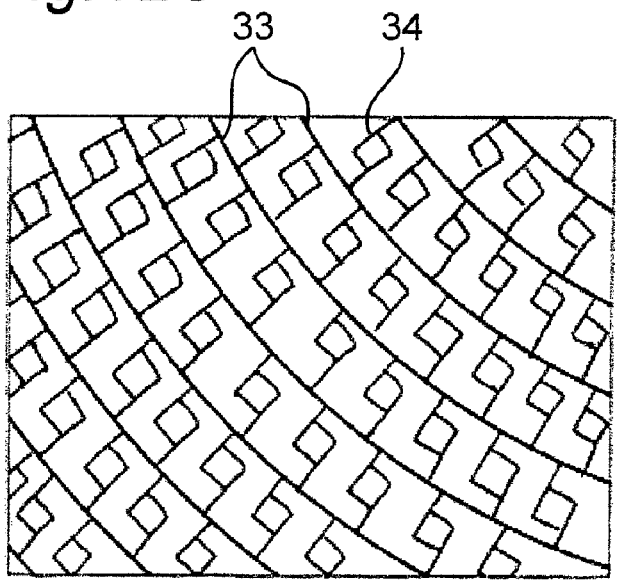
FIG. 12C is a plan view showing a third modified example of the mesh patterns of the metal mesh.
Figure 12D:
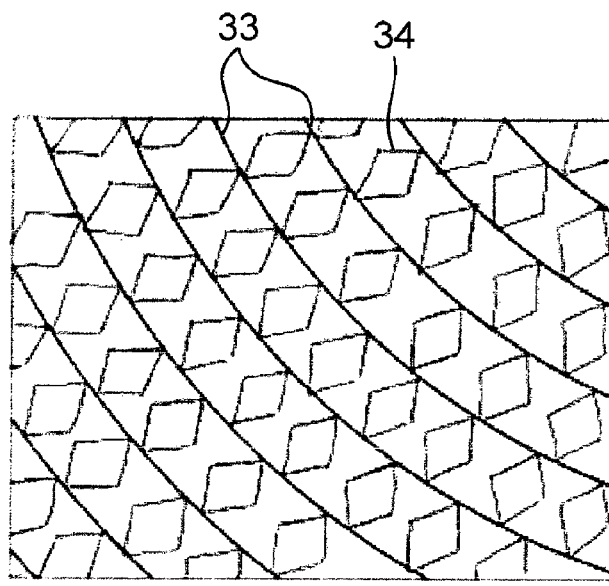
FIG. 12D is a plan view showing a fourth modified example of the mesh patterns of the metal mesh.

It is noted that the present invention is not limited to the first embodiment but may be implemented in various other modes. For example, although the fine band patterns 34 arranged in the third area 20C of the metal mesh 13 are formed into an L shape in the above description, the present invention is not limited to this. The fine band patterns 34 maybe formed into any shape as long as the fine band patterns are capable of connecting the arc-shaped fine band patterns 33, 33 which are adjacent to each other by curved lines. For example, the fine band patterns 34 may be formed into an arc shape as shown in FIG. 12A, or in a wavy line shape as shown in FIG. 12B. The fine band patterns 34 may be formed by combining two L-shaped fine bands as shown in FIGS. 12C and 12D. That is, length of the fine bands of the second fine band patterns 34 is longer than straight lines connecting connection points with the fine band patterns 33, 33 which are adjacent to each other and the second fine band patterns 34 by the shortest distance. It is noted that although the fine band patterns 34 are described in the above description, the same is applied to the fine band patterns 32 arranged in the second area 20B of the metal mesh 13. That is, the fine band patterns 32 may be formed into any shape as long as the fine band patterns are capable of connecting the straight fine band patterns 31, 31 which are adjacent to each other by curved lines.

Figure 13A:
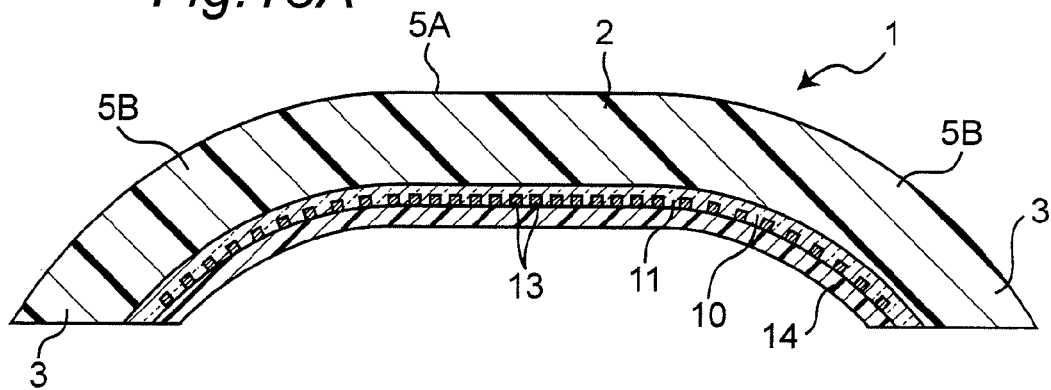
FIG. 13A is a sectional view showing a first modified example of the housing for the cellular phone terminal provided with the mesh sheet according to the first embodiment of the present invention.
Figure 13B:
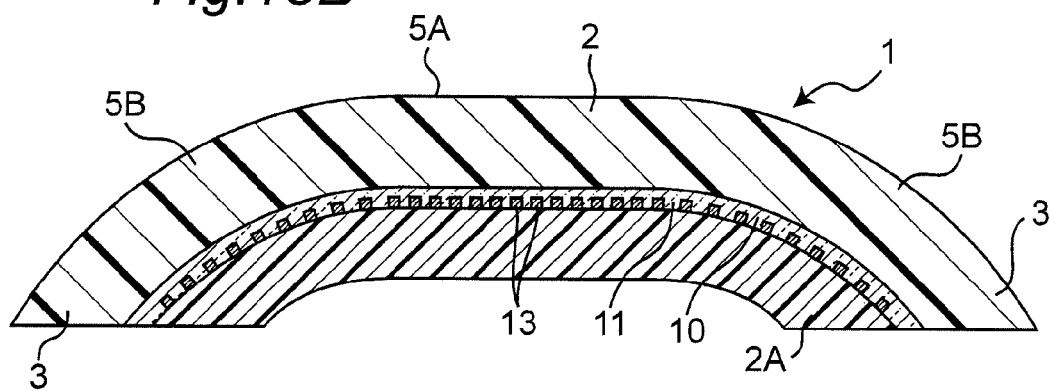
FIG. 13B is a sectional view showing a second modified example of the housing for the cellular phone terminal provided with the mesh sheet according to the first embodiment of the present invention.
Figure 13C:
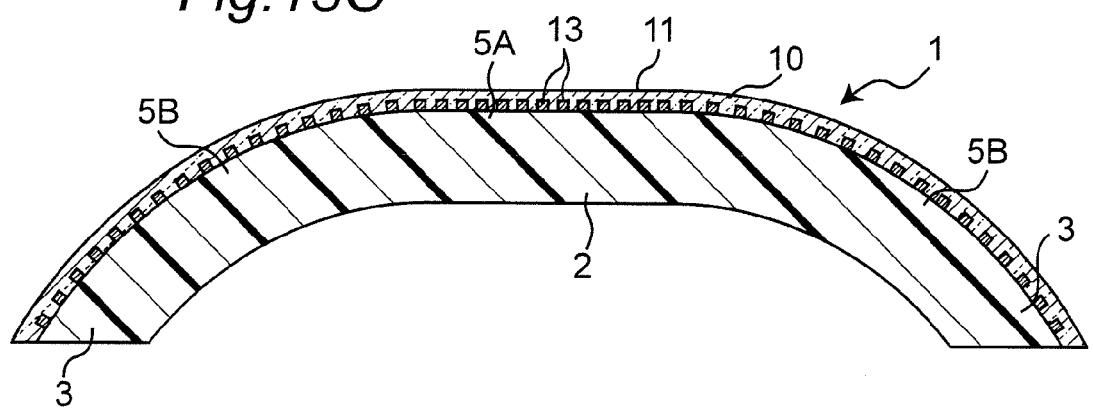
FIG. 13C is a sectional view showing a third modified example of the housing for the cellular phone terminal provided with the mesh sheet according to the first embodiment of the present invention.
Figure 13D:
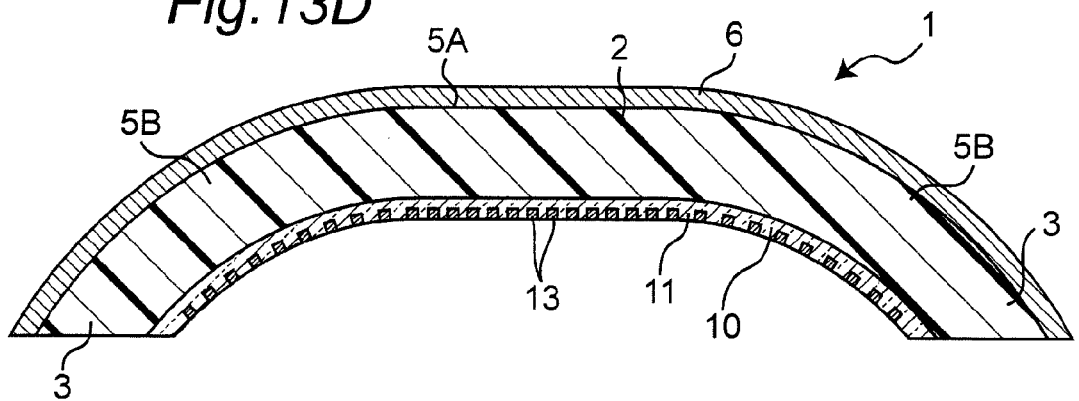
FIG. 13D is a sectional view showing a fourth modified example of the housing for the cellular phone terminal provided with the mesh sheet according to the first embodiment of the present invention.
Figure 13E:
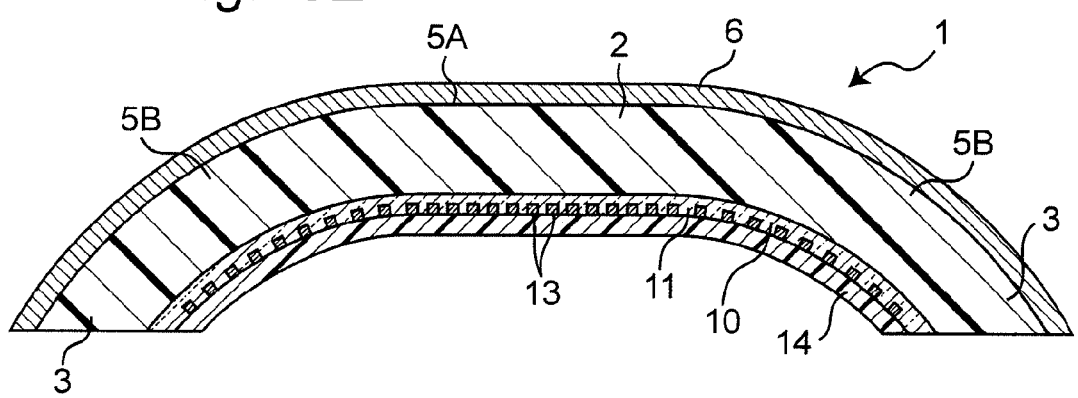
FIG. 13E is a sectional view showing a fifth modified example of the housing for the cellular phone terminal provided with the mesh sheet according to the first embodiment of the present invention.
Figure 13F:
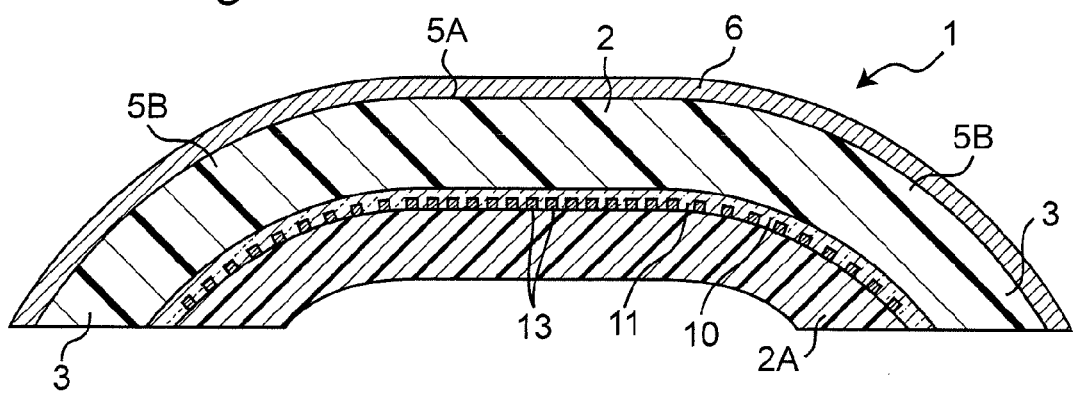
FIG. 13F is a sectional view showing a sixth modified example of the housing for the cellular phone terminal provided with the mesh sheet according to the first embodiment of the present invention.
Figure 13G:
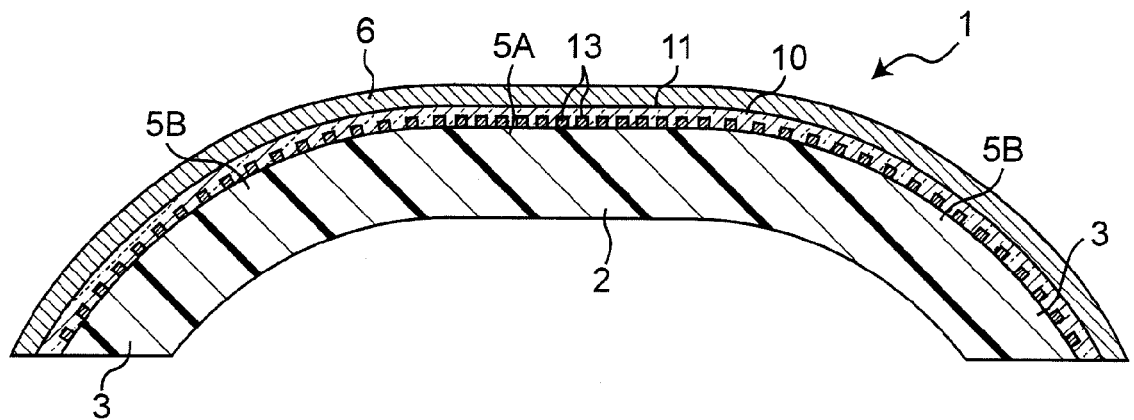
FIG. 13G is a sectional view showing a seventh modified example of the housing for the cellular phone terminal provided with the mesh sheet according to the first embodiment of the present invention.
Figure 13H:
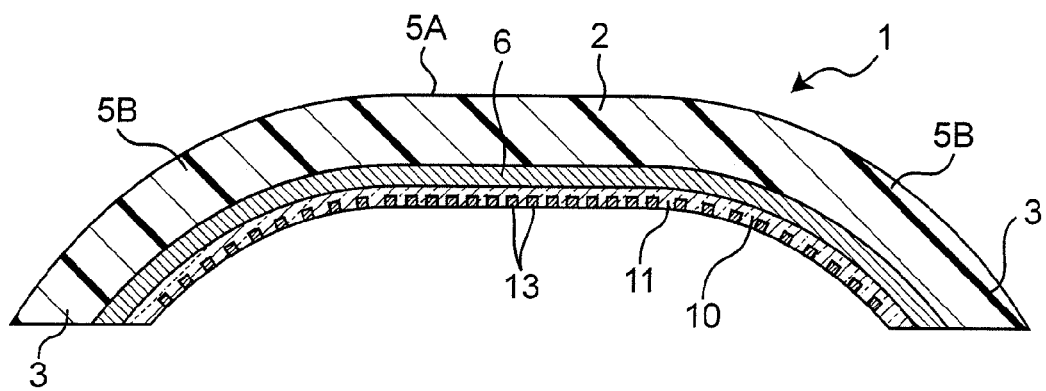
FIG. 13H is a sectional view showing an eighth modified example of the housing for the cellular phone terminal provided with the mesh sheet according to the first embodiment of the present invention.
Figure 13I:
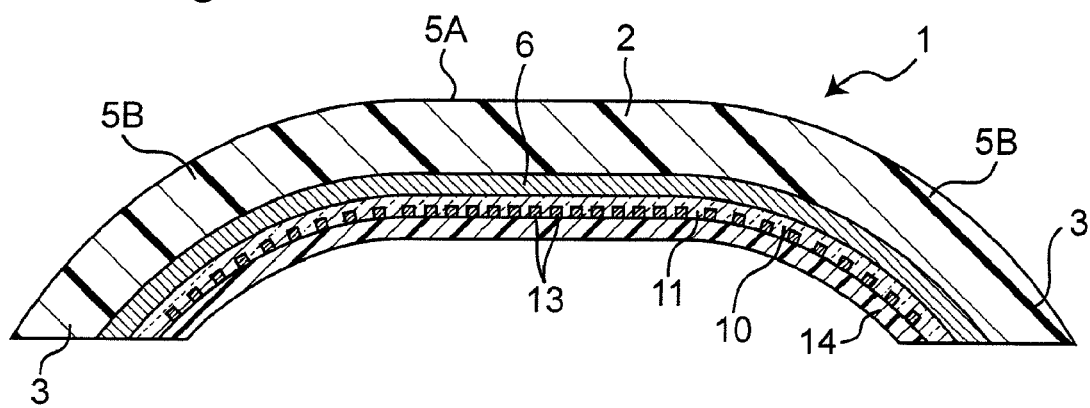
FIG. 13I is a sectional view showing a ninth modified example of the housing for the cellular phone terminal provided with the mesh sheet according to the first embodiment of the present invention.
Figure 13J:
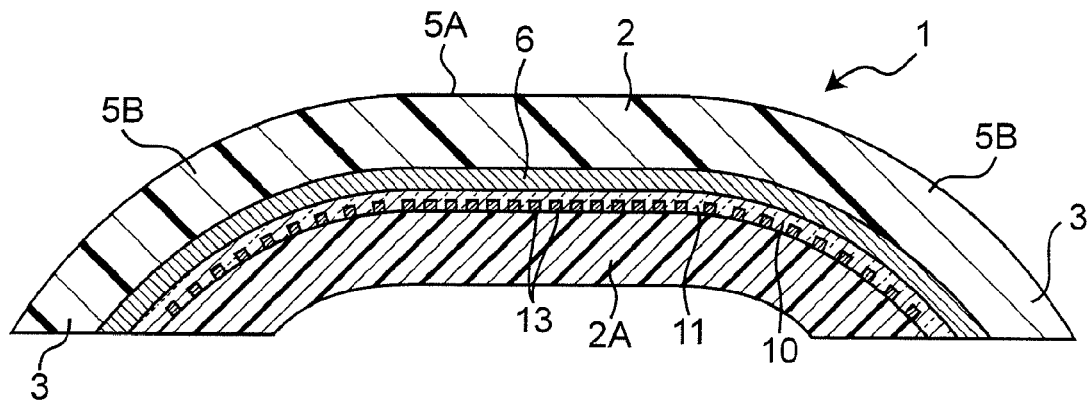
FIG. 13J is a sectional view showing a tenth modified example of the housing for the cellular phone terminal provided with the mesh sheet according to the first embodiment of the present invention.

Although the housing 1 is formed by the molded resin material 2 and the mesh sheet 10 in the above description as shown in FIG. 2, the present invention is not limited to this. For example, as shown in FIG. 13A, a protection sheet 14 may be provided on a surface of the mesh sheet 10 in order to prevent oxidation and damage of the metal mesh 13. A resin sheet with thickness of about 0.1 mm to 0.5 mm such as polycarbonate, polyethylene naphthalate, polyethylene terephthalate, and acrylonitrile-butadiene-styrene resin can be used as this protection sheet 14. As shown in FIG. 13B, molded resin materials 2, 2A may be provided on both surfaces of the mesh sheet 10 by the two-color molding. In this case, it is possible to prevent the oxidation and the damage of the metal mesh 13 and also increase strength as the housings. Thickness of the molded resin material 2A is for example about 1.0 mm. As shown in FIG. 13C, the mesh sheet 10 may be provided on an outer surface of the molded resin material 2 instead of the inner surface of the molded resin material 2. As shown in FIGS. 13D to 13G, a decorative layer 6 may be provided on the surface of the molded resin material 2 or the mesh sheet 10 as an opaque decorative section. The decorative layer 6 may be provided between the molded resin material 2 and the mesh sheet 10 as shown in FIGS. 13H to 13J.

A transfer method, a simultaneous inmold decoration and design transfer method, a simultaneous inmold decoration and design insert method, a coating method, and the like can be used as a forming method of the decorative layer 6. The transfer method is a method including, using a transcription material in which a transcription layer including a separating layer, a decorative layer, and an adhesive layer is formed on a substrate sheet, closely adhering the transfer layer to a transcription object by applying heat and pressure, and then separating the substrate sheet and transcribing the transfer layer alone on a surface of the transcription object for decoration. The simultaneous inmold decoration and design transfer method is a method including inserting a transcription material in a mold, injection-filling a cavity with resin, cooling to obtain a molded resin material and simultaneously bonding a surface thereof with a transcription material, and then separating the substrate sheet and transcribing a transfer layer on a surface of the transcription object for decoration.

Arrangement pitches of the fine band patterns 31, 33 arranged in parallel to the contour line direction D1 are not necessarily regular before adhering to the molded resin material 2 but preferably set to be regular after adhering to the molded resin material 2. After adhering to the molded resin material 2, in a case where the arrangement pitches of the fine band patterns 31, 33 are varied, not only the design property of the molded resin material 2 is deteriorated but also capacitance is differentiated due to a pressing position even when for example the housing 1 is used as the capacitance type touch panel and the same area is pressed. Therefore, there is a possibility that the housing does not sufficiently function as the touch panel.

Figure 14A:
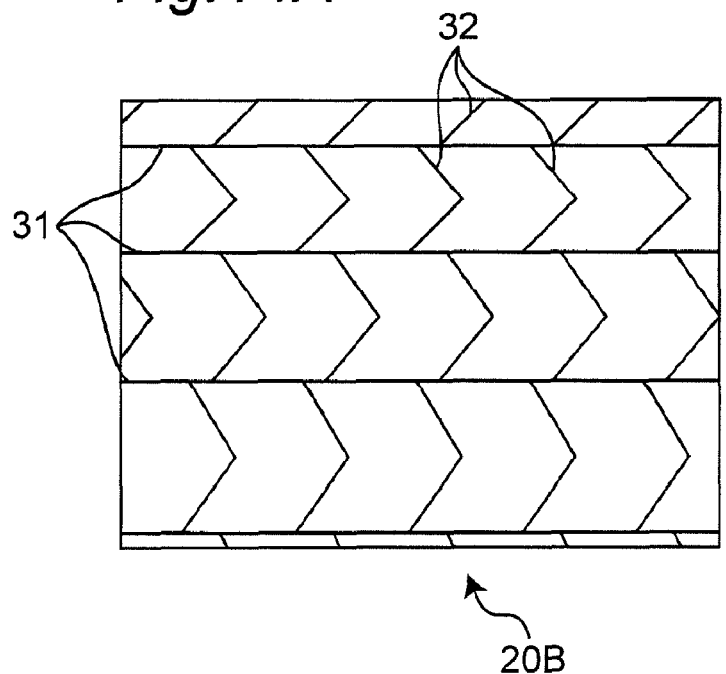
FIG. 14A is an enlarged plan view showing mesh patterns of the metal mesh when the mesh sheet having a regular arrangement pitch of the fine band patterns arranged in parallel to the contour line direction of the two-dimensional curved surface portion is adhered to the two-dimensional curved surface portion.
Figure 14B:
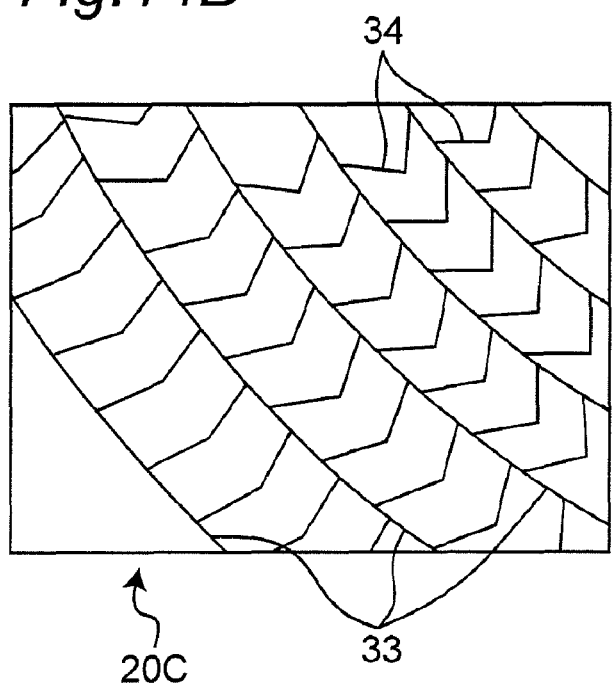
FIG. 14B is an enlarged plan view showing mesh patterns of the metal mesh when the mesh sheet having a regular arrangement pitch of the fine band patterns arranged in parallel to the contour line direction of the three-dimensional curved surface portion is adhered to the three-dimensional curved surface portion.

FIG. 14A is an enlarged plan view showing the mesh patterns of the metal mesh 13 when the mesh sheet 10 having the regular arrangement pitch of the fine band patterns 31 arranged in parallel to the contour line direction D1 of the two-dimensional curved surface portion 5B is adhered to the two-dimensional curved surface portion 5B. FIG. 14B is an enlarged plan view showing the mesh patterns of the metal mesh 13 when the mesh sheet 10 having the regular arrangement pitch of the fine band patterns 33 arranged in parallel to the contour line direction D1 of the three-dimensional curved surface portion 5C is adhered to the three-dimensional curved surface portion 5C.

In a case where the mesh sheet 10 is adhered to the two-dimensional curved surface portion 5B or the three-dimensional curved surface portion 5C, as described above with using FIGS. 5A and 5B, the extension of the metal mesh 13 tends to be increased toward the more drawn section, that is, the outer fringe section of the mesh sheet 10. Therefore, as shown in FIGS. 14A and 14B, the arrangement pitches of the fine band patterns 31, 33 are gradually increased, and the arrangement pitches of the fine band patterns 31, 33 are varied. Thus, the arrangement pitches of the fine band patterns 31, 33 before adhering to the molded resin material 2 are preferably set in consideration with the extension of this metal mesh 13. Specifically, the arrangement pitches of the fine band patterns 31, 33 are gradually narrowed toward the outer fringe section of the metal mesh 13. Thereby, the arrangement pitches of the fine band patterns 31, 33 after adhering can be regular. It is noted that when mesh sheet 10 adhered to the two-dimensional curved surface portion 5B or the three-dimensional curved surface portion 5C is seen in the vertical direction, since the two-dimensional curved surface portion 5B or the three-dimensional curved surface portion 5C is a curved surface, in a part more distant from the viewpoint, a gap of the mesh sheet 10 is seen as narrower. In this case, there is a possibility that the arrangement pitches are seen as varied so that the design property is deteriorated. Meanwhile, when the arrangement pitches of the fine band patterns 31, 33 are as narrow as about 0.1 mm, an issue that the capacitance is differentiated due to the pressing position is not frequently generated. Therefore, in a case where the design property is focused, for example, the arrangement pitches of the fine band patterns 31, 33 may be gradually increased toward the outer fringe section of the metal mesh 13.

Figure 15:
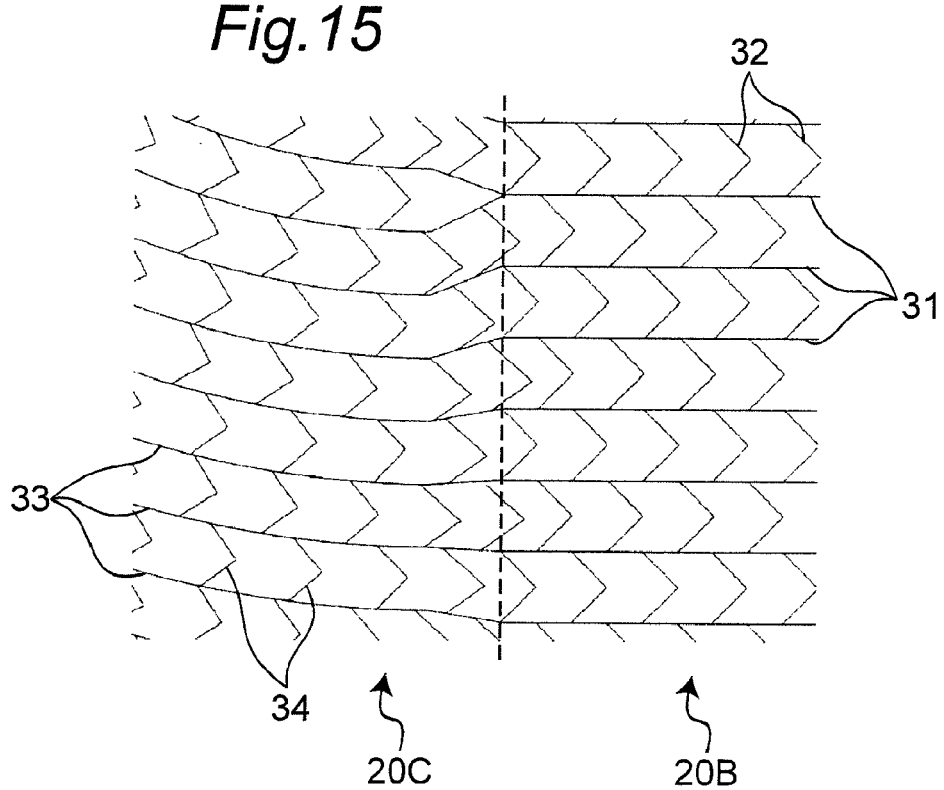
FIG. 15 is an enlarged plan view showing mesh patterns of the coupling part between the area corresponding to the two-dimensional curved surface portion and the area corresponding to the three-dimensional curved surface portion of the metal mesh in the mesh sheet according to a modified example of the present invention.

As described above, the extension of the metal mesh 13 is larger in a case where the mesh sheet is adhered to the two-dimensional curved surface portion 5B than in a case where the mesh sheet is adhered to the three-dimensional curved surface portion 5C. Therefore, when the arrangement pitch of the fine band patterns 33 and the arrangement pitch of the fine band patterns 31 are the same before adhering, the arrangement pitch of the fine band patterns 33 is larger than the arrangement pitch of the fine band patterns 31 after adhering, and there is a possibility that an issue of variation is generated. Thus, as shown in FIG. 15, the arrangement pitch of the fine band patterns 33 is preferably narrower than the arrangement pitch of the fine band patterns 31. Thereby, the arrangement pitch of the fine band patterns 31 and the arrangement pitch of the fine band patterns 33 can be the same after adhering.

Figure 16:
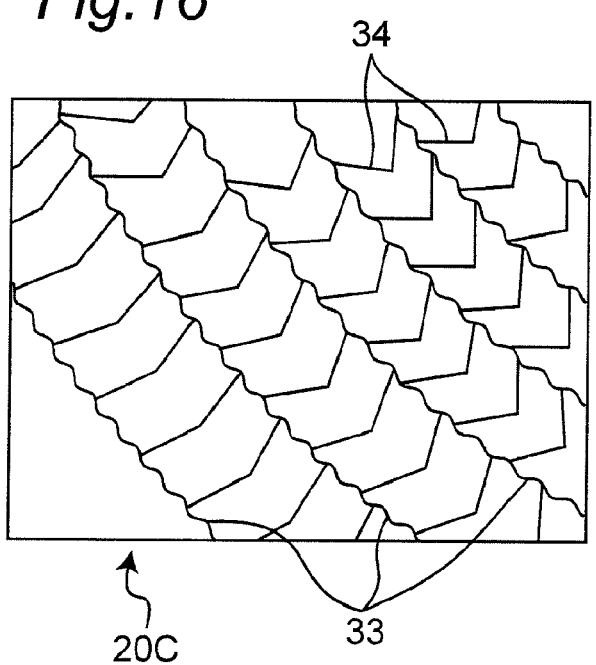
FIG. 16 is an enlarged plan view showing mesh patterns of the area corresponding to the three-dimensional curved surface portion of the metal mesh in the mesh sheet according to a modified example of the present invention.

As described above, since the metal mesh 13 is contracted in the contour line direction D1 in the three-dimensional curved surface portion 5C, the fine band patterns 33 receive compression force in the contour line direction D1. At this time, when the compression force concentrates on a part of the fine band patterns 33, there are possibilities that the fine band patterns 33 are broken and largely deformed over other fine band patterns. Therefore, as shown in FIG. 16, the fine band patterns 33 may be formed into wavy line patterns in order to allow the contraction in the contour line direction D1 in the three-dimensional curved surface portion 5C. Thereby, it is possible to prevent the compression force from concentrating on a part of the fine band patterns 33 and prevent the issue such as the breaking of the fine band patterns 33.

In the drawing, the fine band patterns 31, 32 appear to have substantially same widths. However, as shown in FIG. 17, the band widths of the fine band patterns 32 in the vicinity of connection points with the fine band patterns 31 and the fine band patterns 32 are preferably thicker than the other parts. Thereby, it is possible to enhance connection strength with the fine band patterns 31 and the fine band patterns 32 and prevent the issue such as floating generated in the fine band patterns 32. Similarly, the band widths of the fine band patterns 34 in the vicinity of connection points with the fine band patterns 33 and the fine band patterns 34 are also preferably thicker than the other parts.

Second Embodiment

As with the first embodiment, a housing provided with a mesh sheet according to a second embodiment of the present invention can be used as the antenna for the cellular phone terminal or the capacitance type touch panel, for example. As one example, the cellular phone terminal using the housing as the antenna will be described.

Figure 18A:
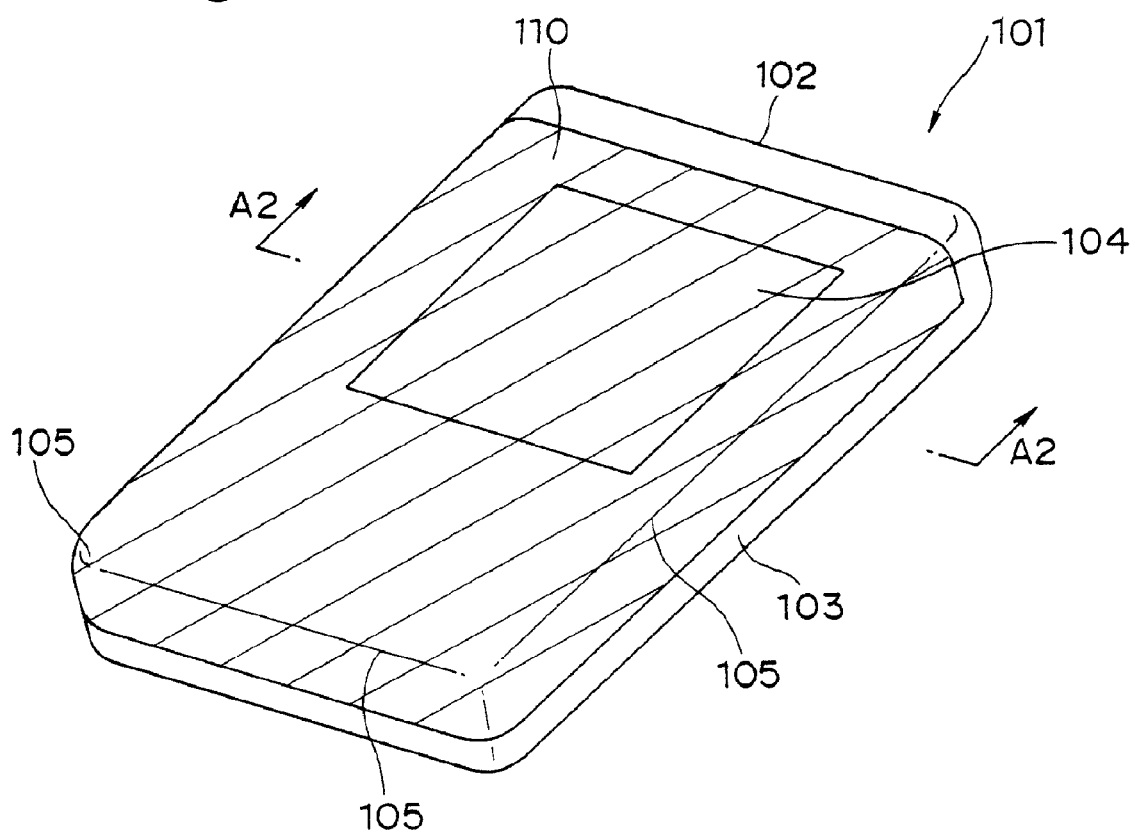
FIG. 18A is a perspective view showing an outer appearance of a housing for a cellular phone terminal using a mesh sheet according to a second embodiment of the present invention.
Figure 18B:
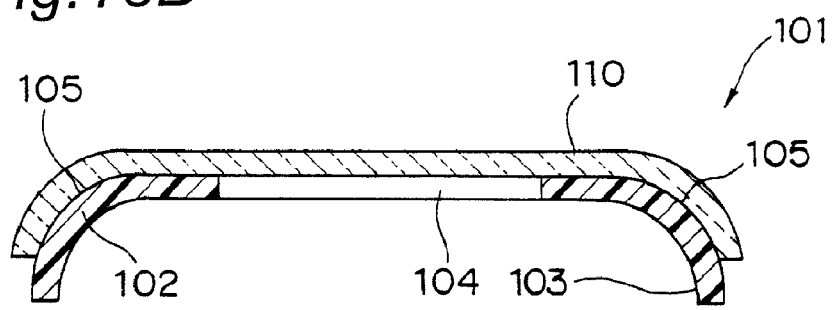
FIG. 18B is a sectional view taken along line A2-A2 of FIG. 18A.

FIG. 18A is a perspective view showing an outer appearance of the housing for the cellular phone terminal provided with the mesh sheet according to the second embodiment. FIG. 18B is a sectional view of the housing for the cellular phone terminal taken along line A2-A2 in FIG. 18A. A housing 101 shown in FIG. 18A has a molded resin material 102 serving as one example of an arbitrary member as a main constituting layer, in which antenna patterns formed by a mesh sheet 110 are formed on a surface of the molded resin material 102. As shown in FIG. 18B, the molded resin material 102 is a container-shaped member provided with a transparent window section 104 and the circumference of a fringe portion 103 of the molded resin material is curved so as to provide curved surface portions 105.

The molded resin material 102 is molded into a shape of the housing 101. As a material of the molded resin material, polycarbonate, acrylic resin, polyethylene terephthalate, triacetyl cellulose, and the like can be used. The transparent window section 104 may be integrally formed by the method such as the two-color molding, or formed by fitting a transparent member made of another molded resin material into an opening for the transparent window section of the molded resin material 102.

An opaque decorative section (not shown) may be provided on a surface of the molded resin material 102. Specifically, a decorative layer may be provided on the surface of the molded resin material 102. The transfer method or the simultaneous inmold decoration and design transfer method can be used as a forming method of the decorative layer. As described above, the transfer method is the method including, using the transcription material in which the transcription layer including the separating layer, the decorative layer, and the adhesive layer is formed on the substrate sheet, closely adhering the transfer layer to the molded resin material 102 serving as the transcription object by applying heat and pressure, and then separating the substrate sheet and transcribing the transfer layer alone on the surface of the transcription object for decoration. As described above, the simultaneous inmold decoration and design transfer method is the method including inserting the transcription material in the mold, injection-filling the cavity with the resin, cooling to obtain the molded resin material and simultaneously bonding the surface thereof with the transcription material, and then separating the substrate sheet and transcribing the transfer layer on the surface of the transcription object for decoration.

As the substrate sheet of the transcription material, a resin sheet such as polypropylene-based resin, polyethylene-based resin, polyamide-based resin, polyester-based resin, polyacrylic resin, and polyvinyl chloride-based resin can be used.

As a material of the separating layer, in addition to polyacrylic resin, polyester-based resin, polyvinyl chloride-based resin, cellulose-based resin, rubber-based resin, polyurethane-based resin, polyvinyl acetate-based resin, and the like, a copolymer such as vinyl chloride-vinyl acetate copolymer-based resin, and ethylene-vinyl acetate copolymer-based resin may be used. In a case where hardness is required for the separating layer, photo-curing resin such as ultraviolet thermosetting resin, radiation curing resin such as electron radiation curing resin, and thermosetting resin can be selected and used.

As the adhesive layer, thermosensitive or pressure sensitive resin suitable as a material for the transcription object is appropriately used. For example, in a case where the material of the transcription object is polyacrylic resin, polyacrylic resin may be used. In a case where the material of the transcription object is polyphenylene oxide copolymer, polystyrene-based copolymer resin, polycarbonate-based resin, styrene-based resin, or polystyrene-based blended resin, polyacrylic resin, polystyrene-based resin, polyamide-based resin, and the like which has an affinity with the above resin may be used.

The mesh sheet 110 having antenna patterns in a planar form having a light transmittance of 70% or higher is adhered to the surface of the molded resin material 102. The mesh sheet 110 is formed over a wide area on the surface of the molded resin material 102, and provided on surfaces of the curved portions 105. The mesh sheet 110 has a metal mesh 113 formed by metal highly-fine bands having mesh patterns as described later. Since the metal mesh 113 are opaque but highly fine, the metal highly-fine bands are only recognized as a slight change in a tone at a glance, so that the design property of the molded resin material 102 is not deteriorated. Moreover, since a relatively large area can be used as the antenna, so that the receiver sensitivity can be enhanced. It is noted that the mesh sheet 110 may also be provided over a surface of the transparent window section 104 for display.

The mesh sheet 110 is for example adhered to the surface of the molded resin material 102 by the following processes. As one example, the mold is closed in a state that the mesh sheet 110 is sandwiched in the mold at the time of molding the molded resin material 102 and the melted resin is injected into the cavity. With such a configuration, the mesh sheet 110 formed into a shape along the surface of the cavity and the melted resin are closely adhered, so that the mesh sheet 110 can be adhered to the surface of the molded resin material 102.

The mesh sheet 110 to be sandwiched in the mold may be preliminarily preformed into a shape along the surface of the cavity. The preforming is performed by pressing the mesh sheet 110 while heating with using the pressing device for preforming, or the like. The mesh sheet 110 is deformed by the pressing force by the pressing device or the injection pressure of the melted resin. Particularly, in a part corresponding to corner portions of the molded resin material 102, a deformed part is extended in the multi-axial directions at the same time.

It is noted that although the housing 101 is formed by adhering the mesh sheet 110 to the inner surface of the molded resin material 102 as shown in FIG. 18B, the present invention is not limited to this. The housing 101 maybe formed by arranging the mesh sheet 110 similarly to the above mesh sheet 10. That is, the housing 101 may be formed in any of modes shown in FIGS. 13A to 13J.

FIG. 19 is a sectional view showing a schematic configuration of the mesh sheet 110. In the mesh sheet 110, the metal mesh 113 is laminated on a surface of a base sheet 111 formed by a resin sheet having the insulation property. An adhesive 112 including thermoplastic resin as a main constituting material is used for adhering the base sheet 111 and the metal mesh 113.

As the base sheet 111, a resin sheet such as polypropylene-based resin, polyethylene-based resin, polyamide-based resin, polyester-based resin, polyacrylic resin, and polyvinyl chloride-based resin can be used.

The adhesive 112 is preferably made of a material with the plasticity slightly increased by heat applied at the time of preforming or at the time of injecting the melted resin. Specifically, at the time of preforming or at the time of injecting the melted resin, the mesh sheet 110 is heated to substantially 180° C. Thus, an acrylic material, and the like with the plasticity increased at about the temperature can be used. As described later, the adhesive 112 is preferably formed to be about 30 to 50 μm which is slightly thicker than usual (generally, about 20 μm) so that the adhesive is easily deformed at the time of extending.

The metal mesh 113 is formed by a metal foil with thickness of substantially 10 μm, and a metal thin film such as copper, nickel, aluminum, gold, and silver can be used. In the metal mesh 113, for example, minute mesh patterns are formed by the photo-etching or the etching with using the print resist.

In a case where the mesh patterns are formed by the photo-etching, firstly, as shown in FIG. 20, a metal foil 113a is adhered to a surface of the base sheet 111. It is noted that in FIG. 20, the adhesive 112 is omitted. Then, a photoresist film (not shown) is formed and subjected to exposure with using the photomask and development using the liquid developer, so that mesh patterns of the photoresist film are formed. The etching is performed with the etchant, and the photoresist film is separated and removed, so that the metal mesh 113 having the mesh patterns formed by highly-fine metal lines is formed.

As described above, upon the deformation of the mesh sheet 110 at the time of preforming or at the time of injecting the melted resin, the base sheet 111 and the metal mesh 113 are extended in the multi-axial directions. However, the resin base sheet 111 is endurable to relatively large deformation, while the metal mesh 113 is not endurable to large deformation. Thus, when the metal mesh is deformed (extended) to a fixed extent or more, there is an issue that the fine bands are broken. With the mesh sheet 110 according to the second embodiment, in order to improve the issue of breaking at the time of extending, this issue is improved by devising the mesh patterns of the metal mesh 113.

Specifically, the mesh patterns of the metal mesh 113 include unit patterns continuously arranged in the multi-axial directions, and leg portions arranged so as to connect a plurality of the unit patterns, and in the arbitrary unit pattern, the fine band of the unit pattern placed between connection points with the leg portions and the unit pattern is a curved line. With such a configuration, in a case where extension force is applied onto the metal mesh 113, a degree of curving in a curved part is reduced by stress applied onto the fine band forming the unit pattern, so that the mesh patterns can be extended as a whole. The adhesive 112 is made of the material with the plasticity slightly increased by heat provided at the time of preforming or at the time of injecting the melted resin. Thus, in a case where the stress is applied onto the fine band of the mesh pattern, the adhesive is deformed between the base sheet 111 and the metal mesh 113, so that sliding of relative positions of the both is generated. Therefore, the destruction of the fine bands of the metal mesh 113 is suppressed.

Band widths of the fine bands forming the mesh patterns are formed to be substantially 40 μm or less. When the band widths of the fine bands are thick, the mesh patterns are easily visually recognized, so that the design property of the housing maybe deteriorated. However, in a part which does not require the design property, the bandwidths can be larger than the above range.

Second Configuration Example of Mesh Pattern

Figure 21A:
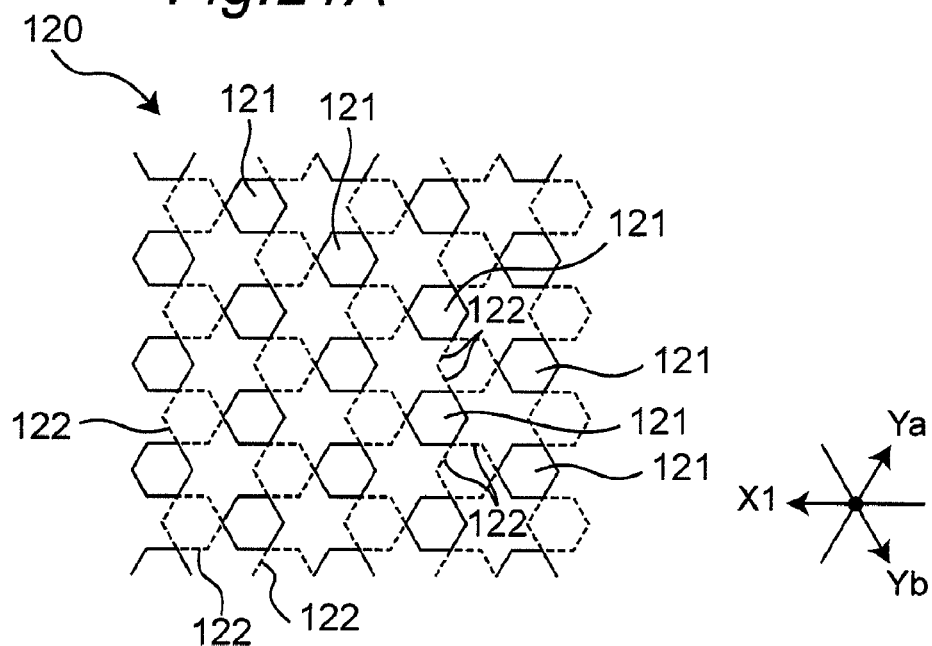
FIG. 21A is a view showing a first configuration example of the mesh patterns of the metal mesh used in the mesh sheet of FIG. 19.
Figure 21B:
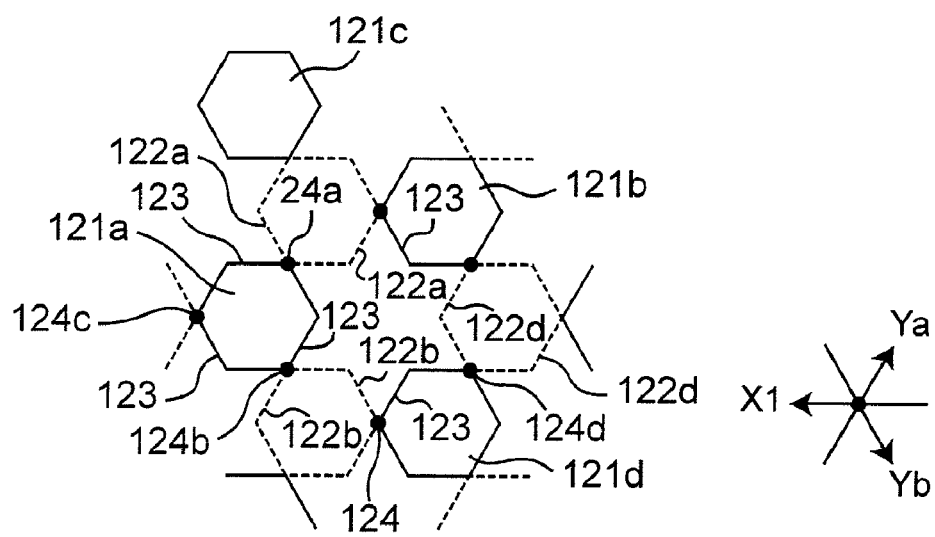
FIG. 21B is a partially enlarged view of the mesh patterns of FIG. 21A.

FIG. 21A is a view showing a first configuration example of the mesh patterns of the metal mesh used in the mesh sheet of FIG. 19. FIG. 21B is a partially enlarged view of the mesh patterns of FIG. 21A. Hereinafter, in a case where the mesh patterns are shown in the figures, the unit patterns are shown by solid lines and the leg portions are shown by broken lines in order to distinguish the unit patterns and the leg portions. However, all the actual mesh patterns are formed by continuously connecting the metal thin films.

As shown in FIGS. 21A, 21B, in mesh patterns 120, regular-hexagon unit patterns 121 are continuously arranged along the axes in the X1 direction and the Ya and Yb directions which are crossing each other by 120°. Two leg portions 122 are connected to every other tip out of the tips in one unit pattern 121 so as to be connected to the adjacent unit pattern 121.

A unit pattern 121a of FIG. 21B will be specifically described as an example. Pairs of leg portions 122a, 122b, 122c are respectively provided from three tips 124a, 124b, 124c in the regular-hexagon unit pattern 121a. The three tips are provided due to the fact that the mesh patterns in which the unit patterns are coupled in a planar form cannot be formed unless the leg portions are extended from at least three tips. Therefore, the leg portions may be extended from four tips, for example. The two leg portions 122a extended from the tip 124a are respectively connected to adjacent unit patterns 121b and 121c. The two leg portions 122b extended from the tip 124b are respectively connected to two adjacent unit patterns.

A fine band 123 of the unit pattern 121a placed between the two tips 124a, 124b of the unit pattern 121a, that is, between connection points 124a, 124b with the unit pattern 121a and the leg portions is a curved line.

Figure 22A:
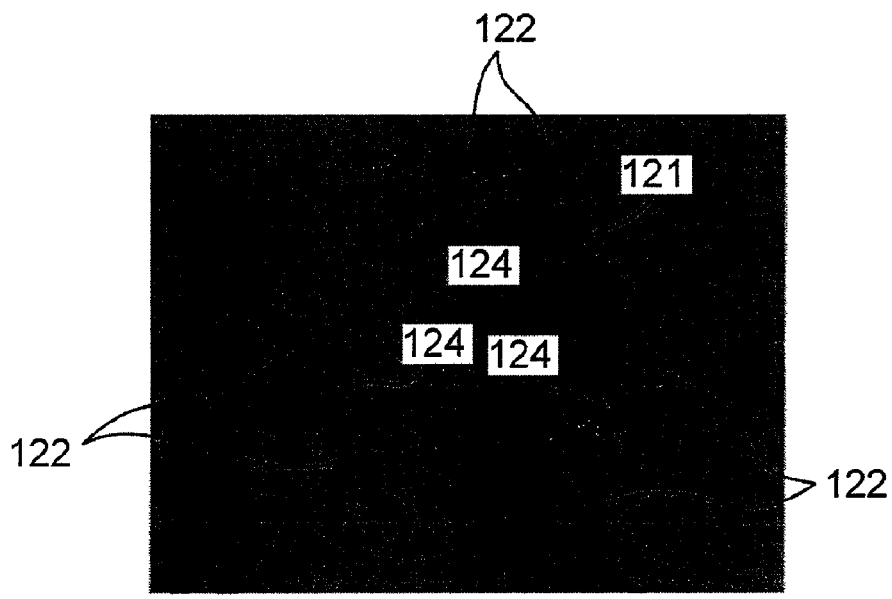
FIG. 22A is an enlarged photograph of a unit pattern before extension of the mesh sheet of FIG. 21A.
Figure 22B:
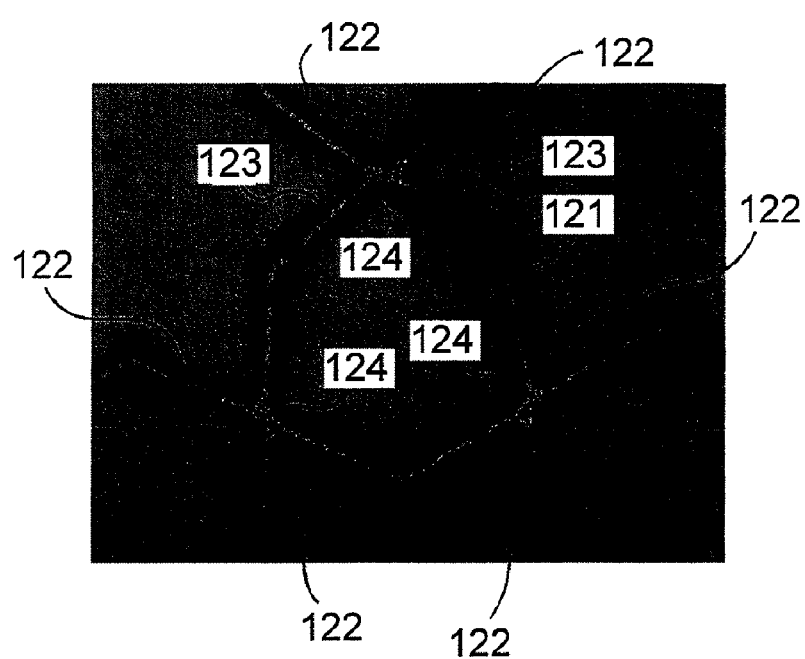
FIG. 22B is an enlarged photograph of the unit pattern after the extension of the mesh sheet of FIG. 21A.

FIG. 22A is an enlarged photograph of the unit pattern before the extension of the mesh sheet of FIG. 21A, and FIG. 22B is an enlarged photograph of the unit pattern after the extension of the metal mesh of FIG. 21A. With such a configuration adopted, as shown in FIGS. 22A, 22B, it is found that the fine band 123 of the unit pattern placed between the connection points 124, 124 with the leg portions 122 and the unit pattern 121 is deformed to be closer to a straight line, and the distance between the two connection points 124 is extended. Thereby, even when the mesh sheet 110 is deformed to be extended, the fine bands are not broken by the stress applied onto the fine bands of the mesh patterns 120 and the metal mesh is not destructed.

Second Configuration Example of Mesh Pattern

Figure 23:
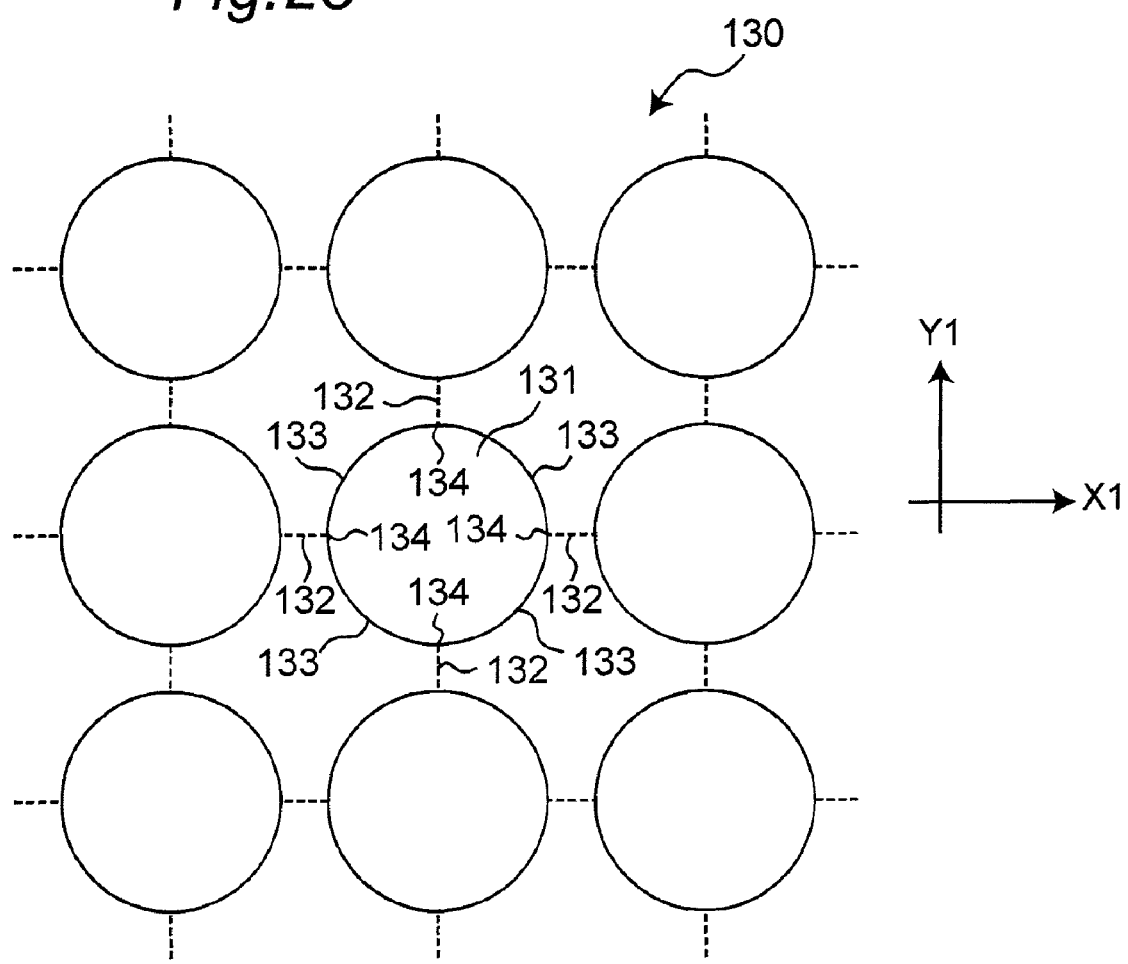
FIG. 23 is a view showing a second configuration example of the mesh patterns of the metal mesh used in the mesh sheet of FIG. 19.

FIG. 23 is a view showing a second configuration example of the mesh patterns of the metal mesh used in the mesh sheet of FIG. 19. As shown in FIG. 23, in mesh patterns 130, unit patterns 131 formed as circular closed figures are arranged in a grid along the X1 axis and the Y1 axis orthogonal to each other. Four leg portions 132 are provided from one circular unit pattern 131 in the X1-axis direction and the Y1-axis direction so as to be coupled to four adjacent unit patterns 131. Regarding one arbitrary unit pattern, the two adjacent leg portions are orthogonal to each other, a fine band 133 of the unit pattern 131 placed between two connection points 134, 134 with the unit pattern 131 and the leg portions 132 is an arc-shaped curved line.

Figure 24A:
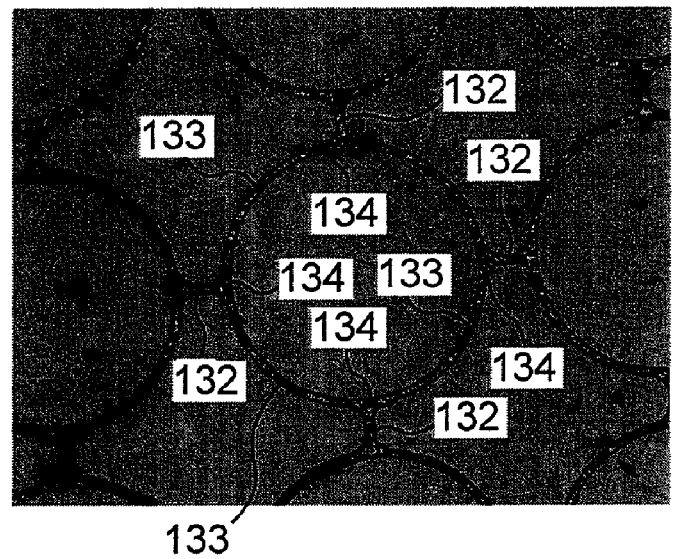
FIG. 24A is an enlarged photograph of a unit pattern before extension of the mesh sheet of FIG. 23.
Figure 24B:
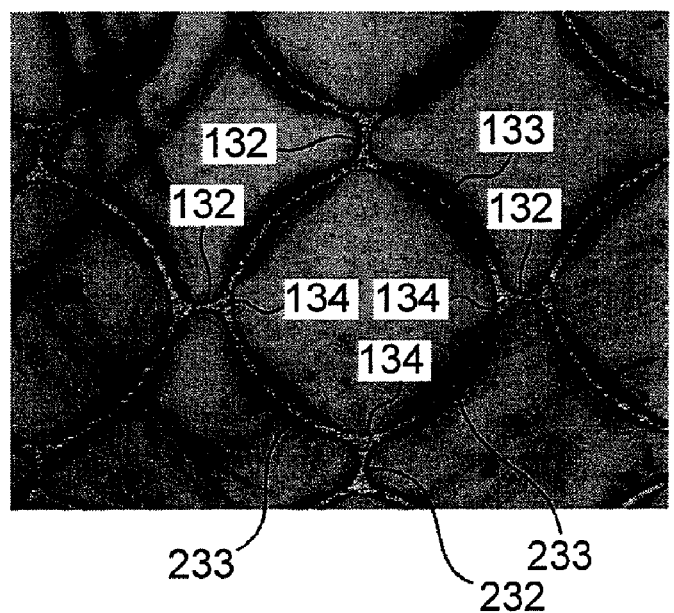
FIG. 24B is an enlarged photograph of the unit pattern after the extension of the mesh sheet of FIG. 23.

FIG. 24A is an enlarged photograph of the unit pattern before the extension of the mesh sheet of FIG. 23, and FIG. 24B is an enlarged photograph of the unit pattern after the extension of the mesh sheet of FIG. 23. With such a configuration adopted, as shown in FIGS. 24A, 24B, the arc-shaped fine band 133 placed between the connection points 134 with the leg portions 132 and the unit pattern is deformed so as to have a smaller curvature, and the distance between the two connection points 134, 134 is extended. Thereby, it is possible to prevent the destruction of the metal mesh at the time of extending the mesh sheet.

Third Configuration Example of Mesh Pattern

Figure 25:
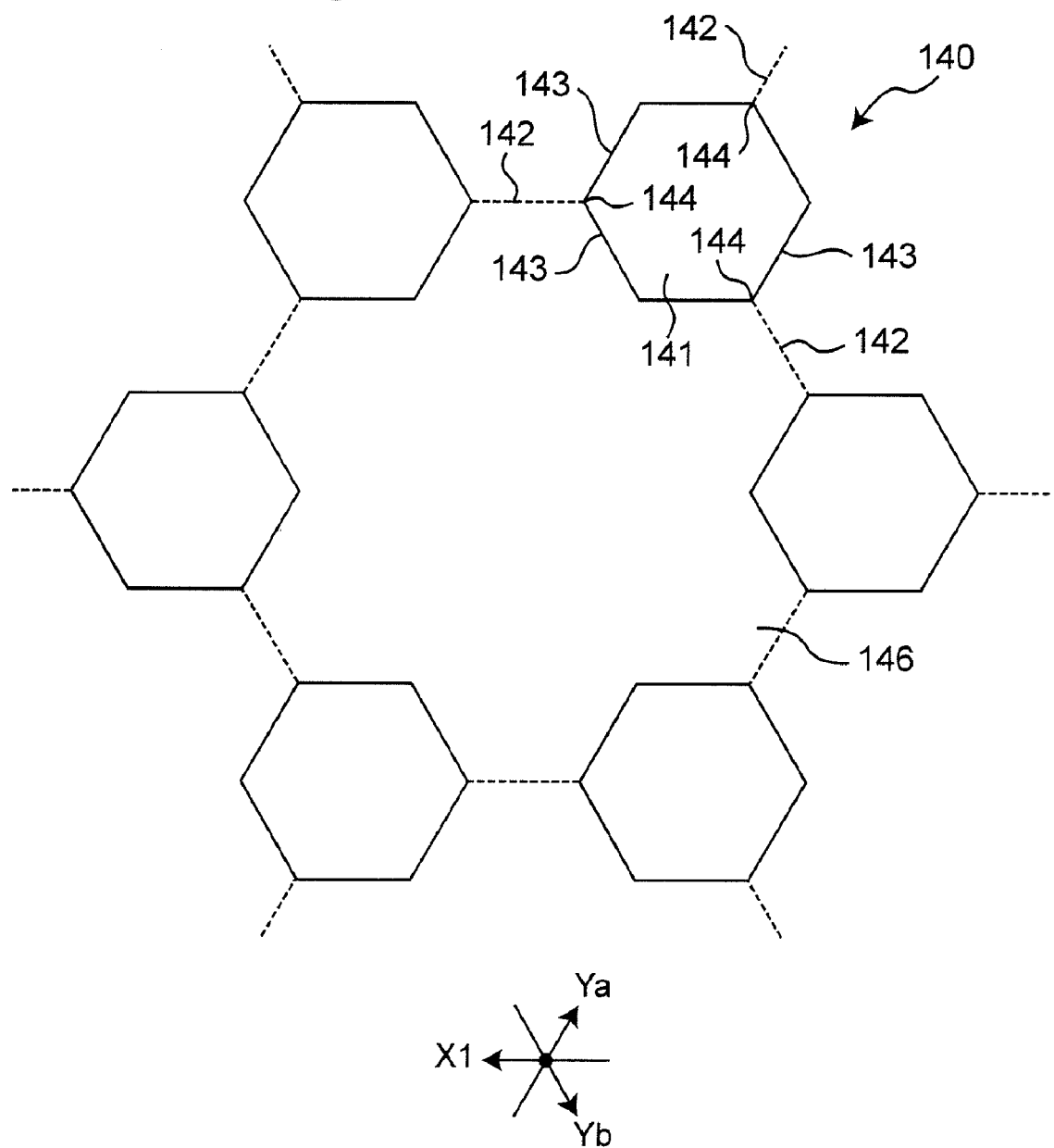
FIG. 25 is a view showing a third configuration example of the mesh patterns of the metal mesh used in the mesh sheet of FIG. 19.

FIG. 25 is a view showing a third configuration example of the mesh patterns of the metal mesh used in the mesh sheet of FIG. 19. As shown in FIG. 25, in mesh patterns 140, regular-hexagon unit patterns 141 formed as closed figures are arranged so as to shape a regular hexagon 146 respectively having sides in the X1 direction and the Ya and Yb directions. Regarding each of the unit patterns, leg portions 142 are connected to every other tip out of the tips in one unit pattern while making an angle of 120° with each other so as to be connected to the adjacent unit patterns 141.

A fine band 143 of the unit pattern 141 placed between two tips 144, 144 of the unit pattern 141, that is, between connection points 144 with the unit pattern 141 and the leg portions 142 corresponds to two adjacent sides of the regular hexagon of the unit pattern and the fine band 123 is a curved line.

FIG. 26 is a view showing deformation states before and after the extension of the unit patterns of FIG. 25. With the configuration shown in FIG. 25 adopted, as shown in FIG. 26, it is found that the fine band 143 of the unit pattern placed between the connection points 144 with the leg portions 142 and the unit pattern is deformed to be closer to a straight line, and the distance between the two connection points 144 is extended.

Fourth Configuration Example of Mesh Pattern

Figure 27:
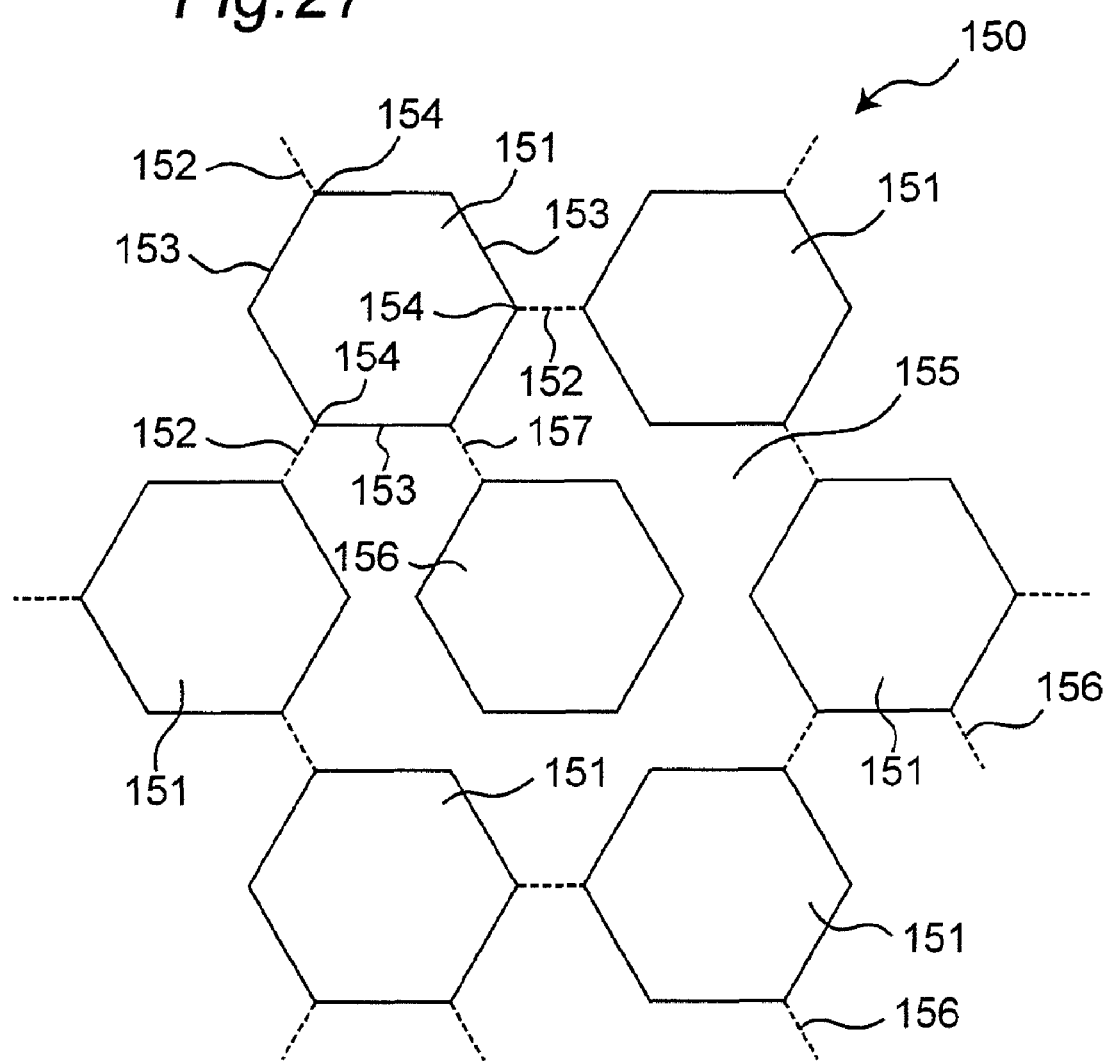
FIG. 27 is a view showing a fourth configuration example of the mesh patterns of the metal mesh used in the mesh sheet of FIG. 19.

FIG. 27 is a view showing a fourth configuration example of the mesh patterns of the metal mesh used in the mesh sheet of FIG. 19. Mesh patterns 150 of FIG. 27 have substantially the same configuration as the mesh patterns of FIG. 25 but are different in terms that another unit pattern 156 is provided in a center part of a hexagon 155 formed by six unit patterns. This unit pattern 156 is provided since visually uneven distribution is increased in the mesh patterns in a case where no fine bands are provided inside the hexagon 155. The unit pattern 156 is connected to any of unit patterns 151 forming the hexagon 155 by a leg portion 157.

Fifth Configuration Example of Mesh Pattern

Figure 28:
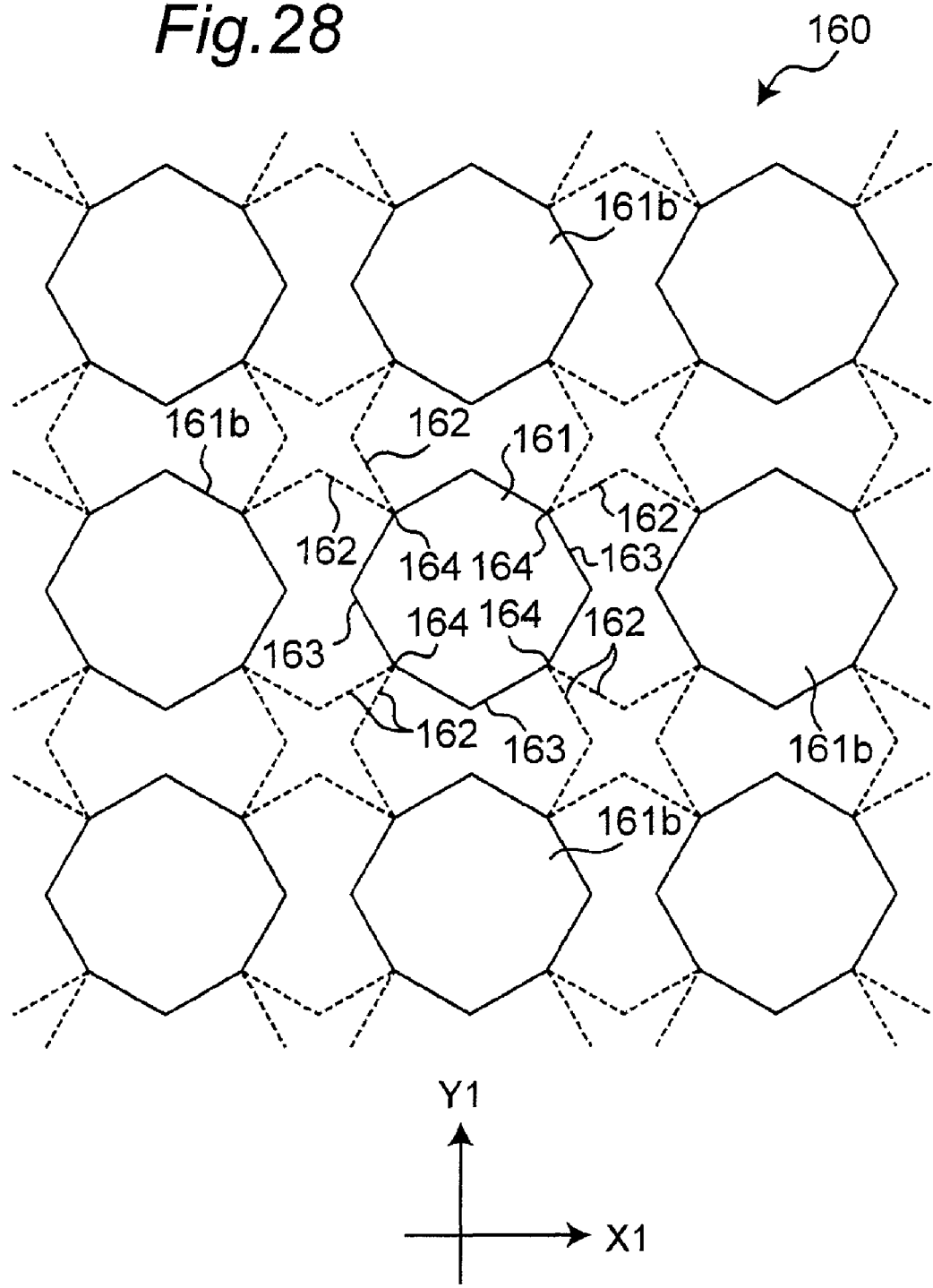
FIG. 28 is a view showing a fifth configuration example of the mesh patterns of the metal mesh used in the mesh sheet of FIG. 19.

FIG. 28 is a view showing a fifth configuration example of the mesh patterns of the metal mesh used in the mesh sheet of FIG. 19. As shown in FIG. 28, in mesh patterns 160, octagon unit patterns 161 are arranged in a grid along the X1 axis and the Y1 axis orthogonal to each other. Pairs of leg portions 162 are respectively provided in every other tip (four in total) out of the tips in one unit pattern 161 so as to be coupled to four unit patterns 161b adjacent to the unit pattern in the X1-axis and Y1-axis directions. Focusing on one arbitrary unit pattern, a fine band 163 of the unit pattern 161 placed between two connection points 164, 164 with the unit pattern 161 and the leg portions 162 corresponds to two adjacent sides of the octagon and the fine band 163 is a curved line.

Sixth Configuration Example of Mesh Pattern

Figure 29:
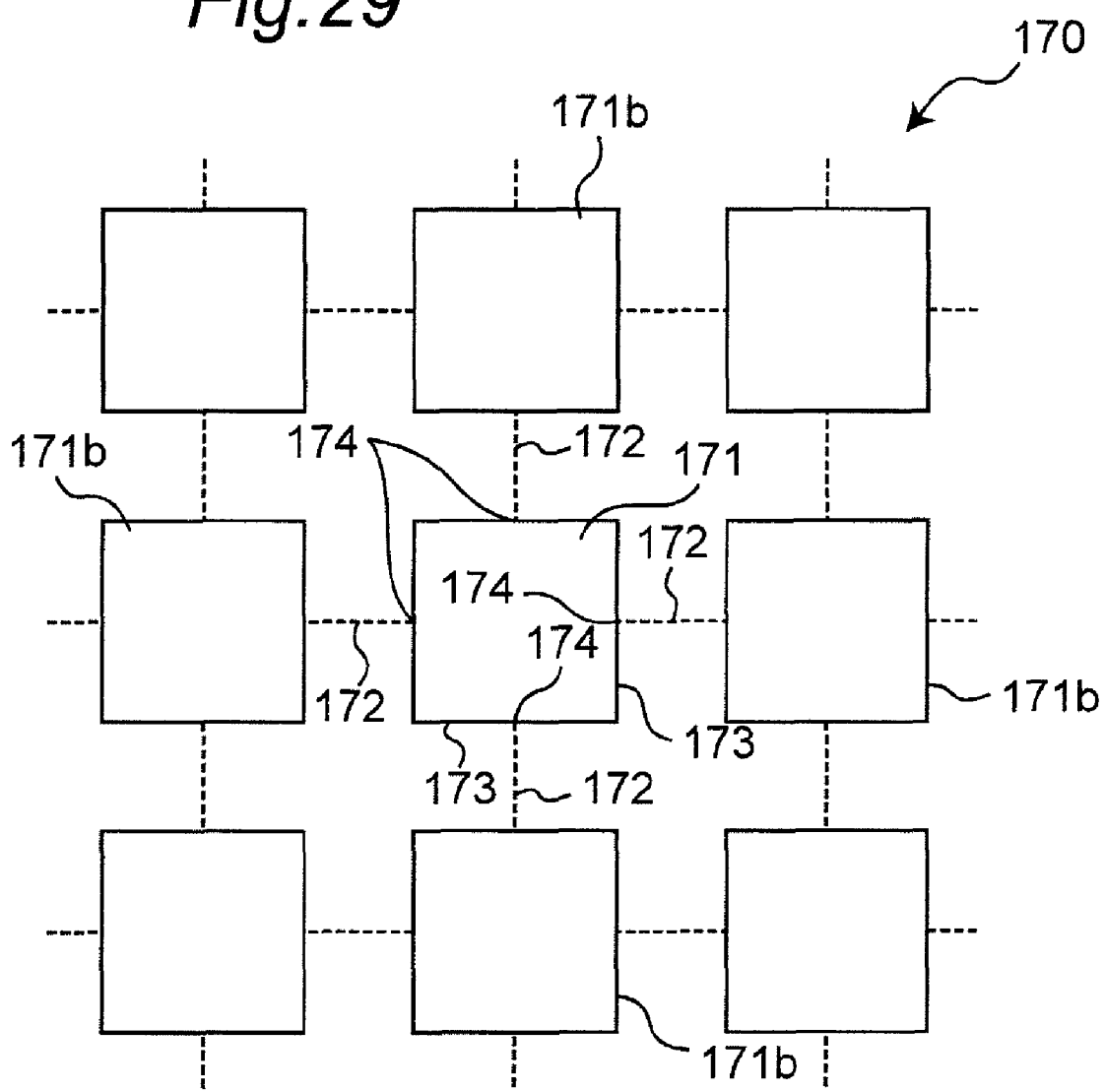
FIG. 29 is a view showing a sixth configuration example of the mesh patterns of the metal mesh used in the mesh sheet of FIG. 19.

FIG. 29 is a view showing a sixth configuration example of the mesh patterns of the metal mesh used in the mesh sheet of FIG. 19. As s shown in FIG. 29, in mesh patterns 170, rectangular unit patterns 171 are arranged in a grid along the X1 axis and the Y1 axis orthogonal to each other. Four leg portions 172 are respectively provided from sides of one unit pattern 171 in the X1-axis and Y1-axis directions so as to be coupled to four unit patterns 171b adjacent to the unit pattern in the X1-axis and Y1-axis directions. Regarding one arbitrary unit pattern, the two adjacent leg portions are connected to the adjacent sides of the unit pattern, and a fine band 173 of the unit pattern 171 placed between two connection points 174, 174 with the unit pattern 171 and the leg portions 172 corresponds to part of two sides making a tip of the unit pattern and the fine band 173 is a curved line.

Seventh Configuration Example of Mesh Pattern

Figure 30:
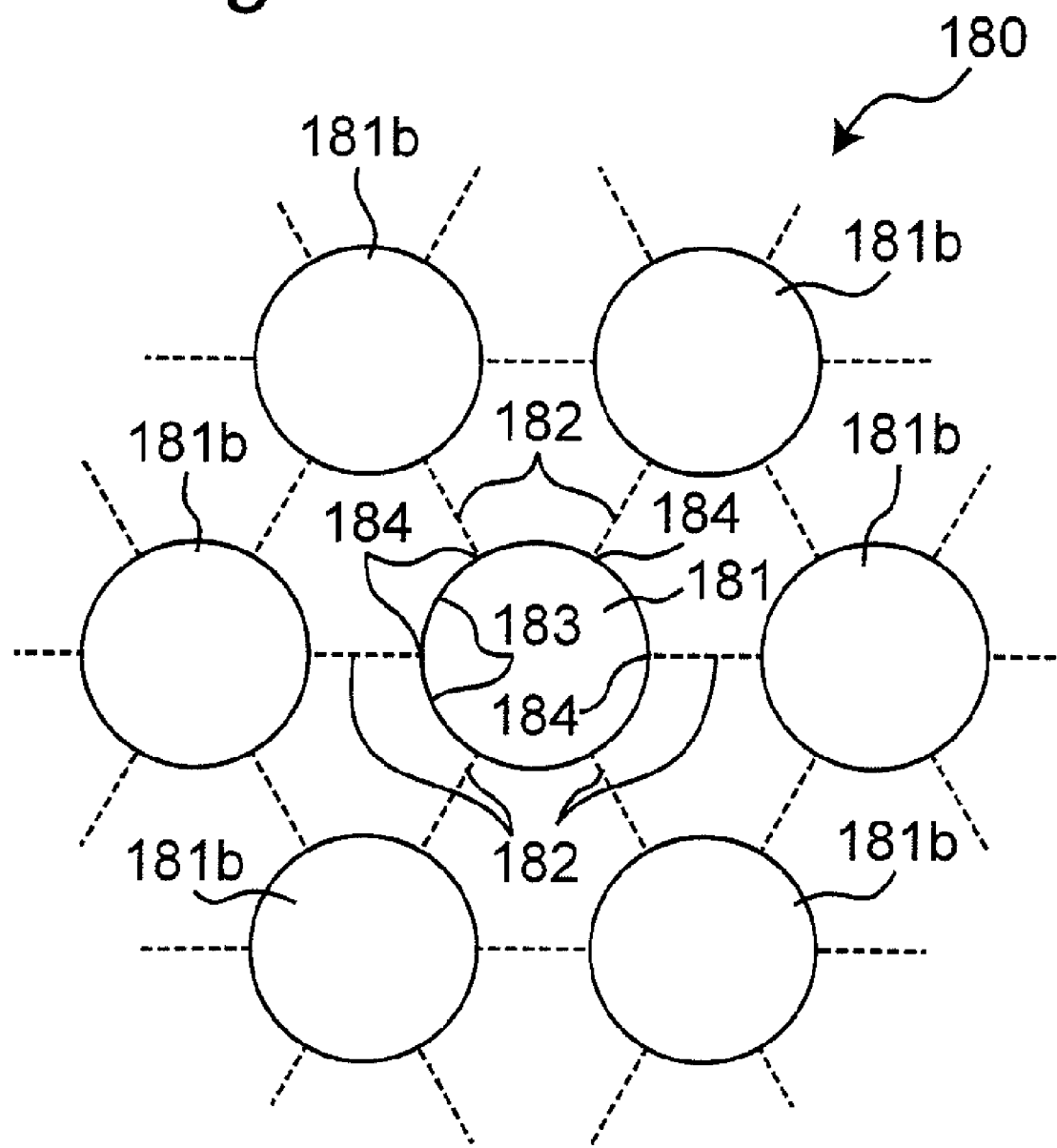
FIG. 30 is a view showing a seventh configuration example of the mesh patterns of the metal mesh used in the mesh sheet of FIG. 19.

FIG. 30 is a view showing a seventh configuration example of the mesh patterns of the metal mesh used in the mesh sheet of FIG. 19. As shown in FIG. 30, in mesh patterns 180, circular unit patterns 181 are respectively continuously arranged along the axes in the X1 direction and the Ya and Yb directions crossing each other by 120°. Six leg portions 182 are provided in one unit pattern while dividing the circumference into six so as to be connected to adjacent unit patterns 181b.

A fine band 183 of the unit pattern 181 placed between two tips 184, 184 of the unit pattern 181, that is, between connection points 184 with the unit pattern 181 and the leg portions 182 corresponds to an arc of the unit pattern and the fine band 183 is a curved line.

Eighth Configuration Example of Mesh Pattern

Figure 31:
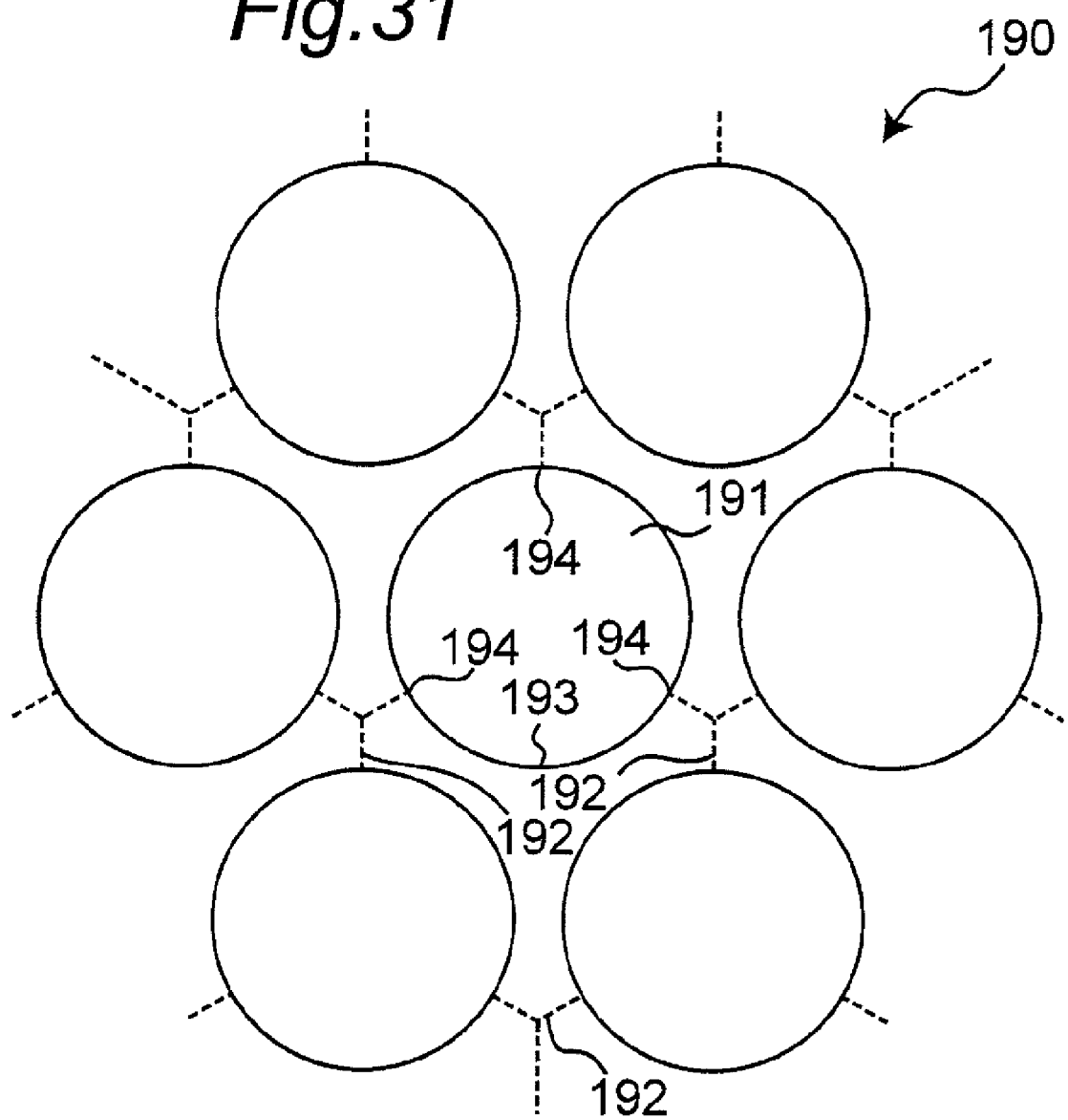
FIG. 31 is a view showing an eighth configuration example of the mesh patterns of the metal mesh used in the mesh sheet of FIG. 19.

FIG. 31 is a view showing an eighth configuration example of the mesh patterns of the metal mesh used in the mesh sheet of FIG. 19. As shown in FIG. 31, in mesh patterns 190, circular unit patterns 191 formed as closed figures are respectively continuously arranged along the axes in the X1 direction and the Ya and Yb directions crossing each other by 120°. Three leg portions 192 are connected to each of the unit patterns 191 while dividing the circumference of one unit pattern 191 into three, that is, making an angle of 120° with each other. The leg portions 192 are diverged into three directions, and diverged ends are respectively connected to the adjacent unit patterns 191.

A fine band 193 of the unit pattern 191 placed between connection points 194 with the unit pattern 191 and the leg portions 192 corresponds to an arc of the unit pattern and the fine band 193 is a curved line.

Ninth Configuration Example of Mesh Pattern

Figure 32:
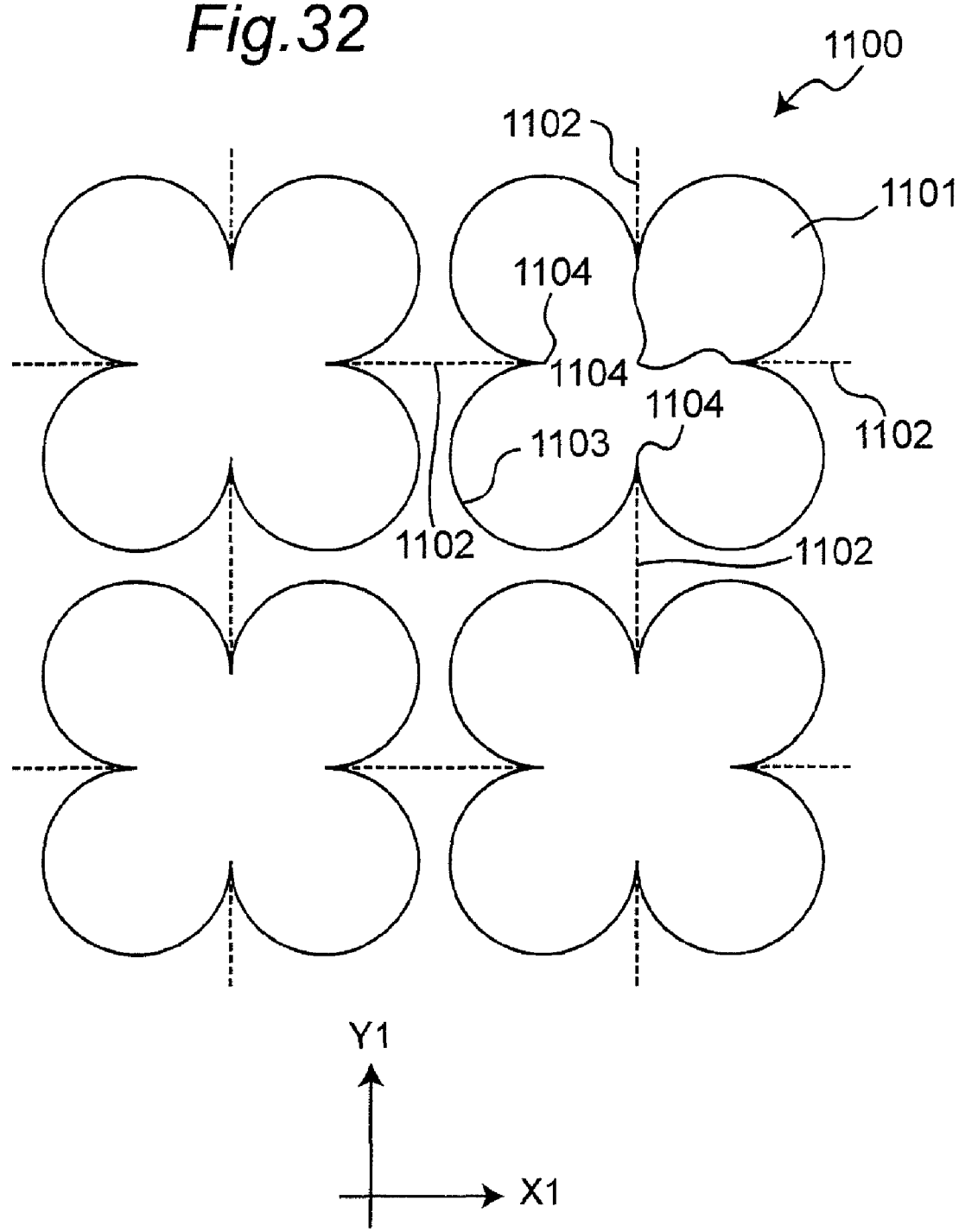
FIG. 32 is a view showing a ninth configuration example of the mesh patterns of the metal mesh used in the mesh sheet of FIG. 19.

FIG. 32 is a view showing a ninth configuration example of the mesh patterns of the metal mesh used in the mesh sheet of FIG. 19. As shown in FIG. 32, in mesh patterns 1100, four-leaf clover shaped unit patterns 1101 formed by combining arcs are arranged in a grid along the X1 axis and the Y1 axis orthogonal to each other. Four leg portions 1102 are provided in one circular unit pattern 1101 in the X1-axis and Y1-axis directions so as to coupled to four adjacent unit patterns 1101b. Regarding one arbitrary unit pattern, the two adjacent leg portions are orthogonal to each other, and a fine band 1103 of the unit pattern 1101 placed between two connection points 1104, 1104 with the unit pattern 1101 and the leg portions 1102 is formed into an arc shape.

As described above, according to the mesh sheet of the second embodiment, in a case where the extension force is applied onto the metal mesh 113, the degree of curving of the curved line parts is reduced by the stress applied onto the fine bands forming the unit patterns. Thus, the mesh patterns can be extended as a whole. The adhesive 112 is made of the material with the plasticity slightly increased by heat applied at the time of preforming or at the time of injecting the melted resin. Thus, in a case where the stress is applied onto the fine bands of the mesh patterns, the adhesive is deformed between the base sheet 111 and the metal mesh 113, so that sliding of relative positions of the both is generated. Therefore, the destruction of the fine bands of the metal mesh 113 is suppressed.

It is noted that the present invention is not limited to the above embodiments but may be implemented in various other modes.

Figure 33A:
FIG. 33A is a view showing a configuration example of the mesh patterns extended in a line shape.
Figure 33B:
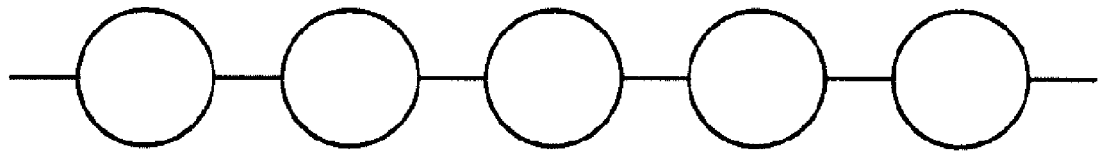
FIG. 33B is a view showing a configuration example of the mesh patterns extended in a line shape.
Figure 34:
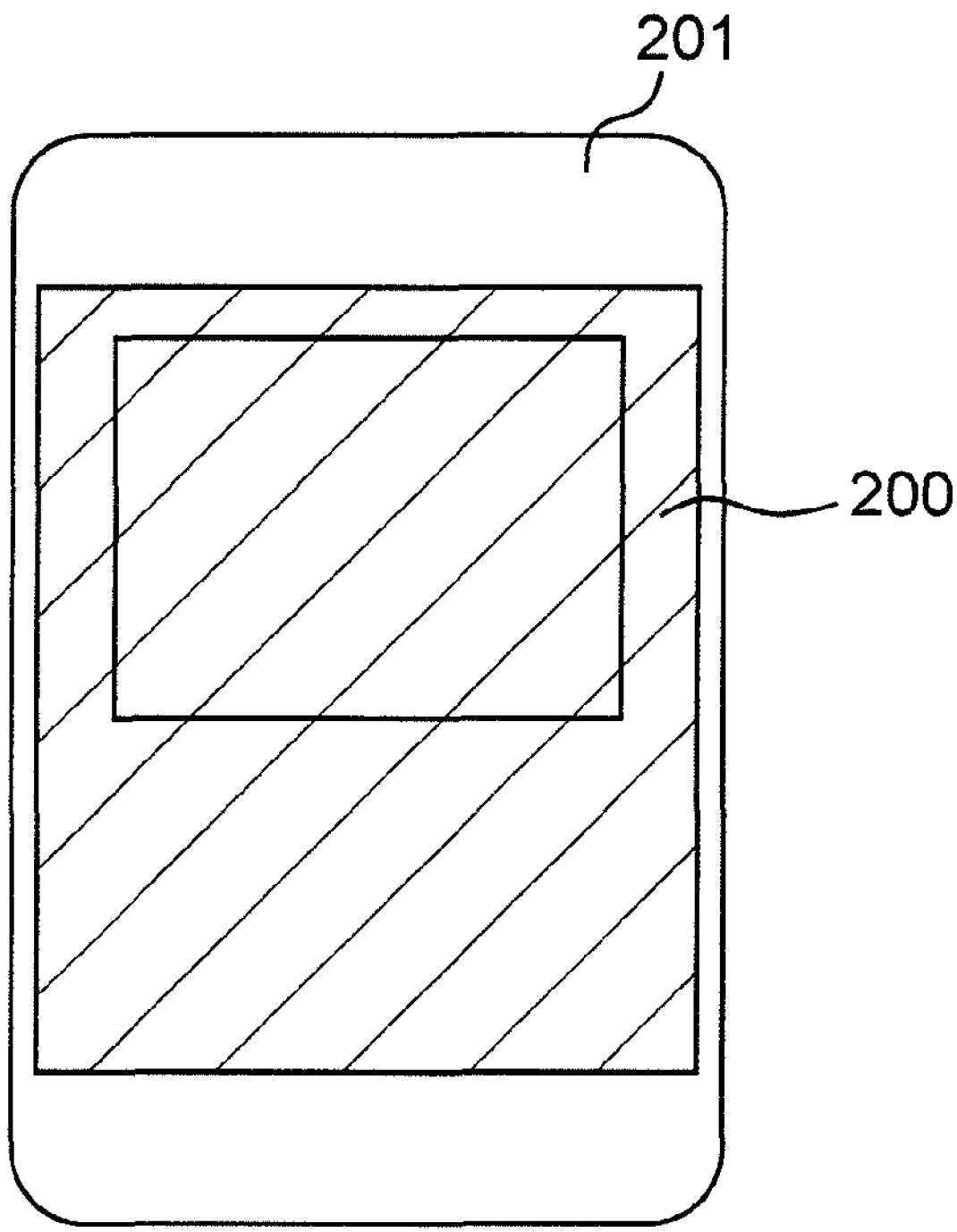
FIG. 34 is a view showing an adhesion state between the mesh sheet and the molded resin material.
Figure 35A:
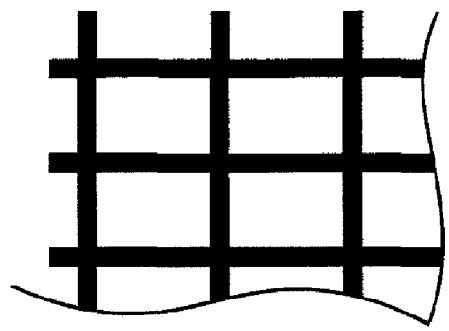
FIG. 35A is a view showing a first configuration example of mesh patterns used in a conventional mesh sheet.
Figure 35B:
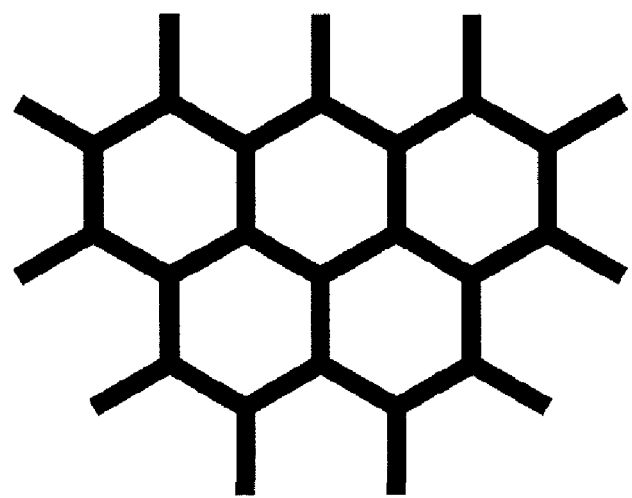
FIG. 35B is a view showing a second configuration example of the mesh patterns used in the conventional mesh sheet.

In the mesh patterns, the unit patterns formed as the closed figures arranged along the multiple axes are connected by the leg portions. However, for example, mesh patterns extended in a line shape as shown in FIGS. 33A, 33B are also available. In the mesh patterns with the substantially extending direction of a line shape shown in FIGS. 33A, 33B, in a case where the stress is applied in the extending direction of the mesh patterns, sliding is generated between the substrate sheet and the metal mesh and the curved line parts are extended. Thus, it is possible to prevent breaking of the fine bands of the metal mesh.

It is noted that by appropriately combining arbitrary embodiments among the various embodiments above, it is possible to obtain effects of the respective embodiments.

INDUSTRIAL APPLICABILITY

The mesh sheet and the housing for the electronic devices according to the present invention appear to be transparent, capable of absorbing the stress relative to the deformation to be placed along the curved surface portion with a large curvature without destructing the metal mesh. Therefore, the mesh sheet and the housing are useful in uses for the antenna for the cellular phone terminal and the capacitance type touch panel, for example.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2008-037258 filed on Feb. 19, 2008, including specification, claims, drawings, and summary are incorporated herein by reference in its entirety.

The invention claimed is:

1. A mesh sheet for a housing for electronic devices in which a metal mesh comprising fine bands is laminated on a surface of a base substrate comprising a resin sheet and having an insulation property, the mesh sheet being used and adhered along a surface of an arbitrary member having at least a three-dimensional curved surface portion, wherein
    the metal mesh has a plurality of first fine band patterns a plurality of and second fine band patterns arranged in a part to be adhered to the three-dimensional curved portion, the first fine band patterns being continuously arranged to be formed into an arc shape in parallel to a contour line direction of the three-dimensional curved portion and to be spaced from each other in a direction orthogonal to the contour line direction, and the second fine band patterns being continuously arranged to connect the first fine band patterns adjacent to each other and to be spaced from each other in the contour line direction, and
    each of the plurality of the second fine band patterns is formed into a curved lines so as to absorb extension in the direction orthogonal to the contour line direction of the metal mesh when the metal mesh is adhered to the three-dimensional surface portion.

2. The mesh sheet according to claim 1, wherein
an arrangement pitch of the first fine band patterns is 0.1 mm or more and 1.0 mm or less.

3. The mesh sheet according to claim 1, wherein
band width of the first fine band pattern and band width of the second fine band pattern are 10 μm or more and 40 μm or less.

4. The mesh sheet according to claim 1, wherein
the base substrate and the metal mesh are adhered to each other with a thermoplastic adhesive.

5. The mesh sheet according to claim 1, wherein
an arrangement pitch of the first fine band patterns is gradually narrowed toward an outer fringe section of the metal mesh.

6. The mesh sheet according to claim 1, wherein
band width of the second fine band pattern in a vicinity of the connection point with the first fine band pattern and the second fine band pattern is larger than band width of other part.

7. The mesh sheet according to claim 1, wherein
the first fine band pattern has wavy line pattern for allowing contraction in the contour line direction of the three-dimensional curved portion.

8. The mesh sheet according to claim 1, wherein
the arbitrary member has a two-dimensional curved portion,
the metal mesh has a plurality of third fine band patterns and a plurality of fourth fine band patterns arranged in a part to be adhered to the two-dimensional curved portion, the third fine band patterns being continuously arranged to be formed into a straight line shape in parallel to a contour line direction of the two-dimensional curved portion and to be spaced from each other in a direction orthogonal to the contour line direction, and the fourth fine band patterns being continuously arranged to connect the third fine band patterns adjacent to each other and to be spaced from each other in the contour line direction, and
the fourth fine band patterns placed between connection points with the third fine band patterns and the fourth fine band patterns are curved lines.

9. The mesh sheet according to claim 8, wherein
an arrangement pitch of the first fine band patterns is narrower than an arrangement pitch of the third fine band patterns.

10. The mesh sheet according to claim 8, wherein
an arrangement pitch of the third fine band patterns is gradually narrowed toward an outer fringe section of the metal mesh.

11. A housing for electronic devices comprising a molded resin material to which a mesh sheet according to claim 1 is adhered.

12. A mesh sheet for a housing for electronic devices in which a metal mesh comprising fine bands is laminated on a surface of a base substrate comprising a resin sheet and having an insulation property, the mesh sheet being used and adhered along a surface of an arbitrary member having a curved surface portion, wherein the metal mesh has a plurality of unit patterns continuously arranged in multi-axial directions and leg portions arranged to connect the mutually adjacent unit patterns, and in any of the unit pattern, a fine band of the unit pattern placed between connection points with the mutually adjacent leg portions and the unit pattern is formed into a curved line so as to absorb extension of the metal mesh when the metal mesh is adhered to the curved surface portion.

13. The mesh sheet according to claim 12, wherein the fine band forming the metal mesh has a width of 40 μm or less.

14. The mesh sheet according to claim 12, wherein the base substrate and the metal mesh are adhered to each other with a thermoplastic adhesive.

15. The mesh sheet according to claim 14, wherein the base substrate is made of thermoplastic resin.

16. The mesh sheet according to claim 12, wherein the unit pattern is formed as closed figure with an identical shape and identical size.

17. The mesh sheet according to claim 16, wherein the unit patterns are arranged in a grid along two imaginary axes orthogonal to each other, and the leg portions are comprised of the fine bands connecting the unit patterns in the directions along the orthogonal imaginary axes.

18. The mesh sheet according to claim 17, wherein the unit pattern is formed as closed figure including arc.

19. The mesh sheet according to claim 17, wherein the unit pattern is formed into polygon, and the leg positions are formed from at least three tips among tips of the polygons.

20. The mesh sheet according to claim 16, wherein the unit patterns are formed into hexagons along three imaginary axes crossing each other by 120°, and the leg portions are comprised of the fine bands connecting the unit patterns in the directions along the three imaginary axes.

21. The mesh sheet according to claim 20, wherein the unit pattern is formed as closed figures including arc.

22. The mesh sheet according to claim 20, wherein the unit pattern is formed into polygon, and the leg positions are formed from at least three tips among tips of the polygon.

* * * * *